United States Patent [19]
Mori et al.

[11] Patent Number: 5,821,627
[45] Date of Patent: Oct. 13, 1998

[54] ELECTRONIC CIRCUIT DEVICE

[75] Inventors: Miki Mori; Yukio Kizaki, both of Yokohama; Takaaki Yasumoto; Koji Yamakawa, both of Kawasaki; Masayuki Saito, Yokohama; Tatsuro Uchida, Yokohama; Takasi Togasaki, Yokohama; Takashi Yebisuya, Tokyo; Taijun Murakami, Yokohama, all of Japan

[73] Assignee: Kabushiki Kaisha Toshiba, Kawasaki, Japan

[21] Appl. No.: 962,882

[22] Filed: Nov. 5, 1997

Related U.S. Application Data

[63] Continuation of Ser. No. 493,530, Jun. 22, 1995, abandoned, which is a continuation-in-part of Ser. No. 209,067, Mar. 11, 1994, abandoned.

[30] Foreign Application Priority Data

| | | | |
|---|---|---|---|
| Mar. 11, 1993 | [JP] | Japan | 5-051119 |
| Sep. 1, 1993 | [JP] | Japan | 5-216805 |
| Sep. 20, 1993 | [JP] | Japan | 5-232871 |
| Dec. 22, 1994 | [JP] | Japan | 6-319860 |

[51] Int. Cl.⁶ .......................... H01L 23/48; H01L 23/52; H01L 29/40
[52] U.S. Cl. .......................... 257/780; 257/781; 257/737; 257/765
[58] Field of Search .................................. 257/778, 779, 257/780, 784, 782, 785, 786, 737, 738, 765

[56] References Cited

U.S. PATENT DOCUMENTS

| | | |
|---|---|---|
| 4,912,545 | 3/1990 | Go . |
| 4,922,322 | 5/1990 | Mathew . |
| 5,196,726 | 3/1993 | Nishiguchi et al. . |

FOREIGN PATENT DOCUMENTS

| | | |
|---|---|---|
| 61-287238 | 12/1986 | Japan . |
| 62-9642 | 1/1987 | Japan . |

OTHER PUBLICATIONS

Van Nostrand Reinhold Company, pp. 280–281, 1964, Robert E. Reed–Hill, "Physical Metallurgy Principles".

Solid State Technology, vol. 34, No. 12, pp. 37–38, Dec. 1991, Thomas H. Ramsey, et al., "The Effect of Ultrasonic Frequency on Intermetallic Reactivity of AU–AL Bonds".

Primary Examiner—Jerome Jackson
Assistant Examiner—S. V. Clark
Attorney, Agent, or Firm—Oblon, Spivak, McClelland, Maier & Neustadt, P.C.

[57] ABSTRACT

An electronic circuit device includes a substrate, a wiring layer formed on the surface of the substrate and essentially consisting of at least one metal selected from the group consisting of gold, copper, tin, and aluminum, a bump formed on the wiring layer and essentially consisting of at least one metal selected from the group consisting of gold, copper, and aluminum, and a micro electronic element formed on the bump, wherein solid-phase diffusion bonding is performed at least either between the wiring layer and the bump or between the bump and an electrode of the micro electronic element.

20 Claims, 23 Drawing Sheets

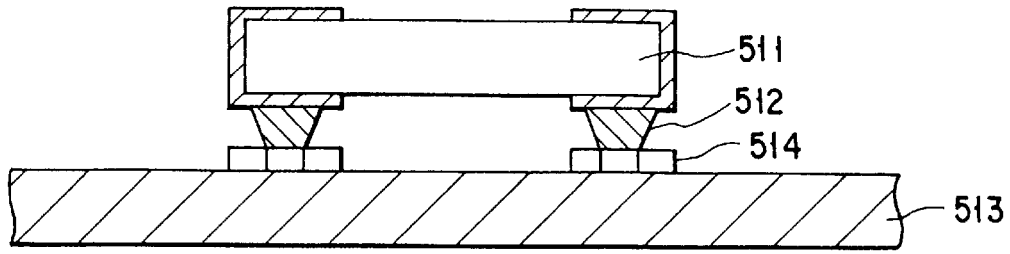
F I G. 5
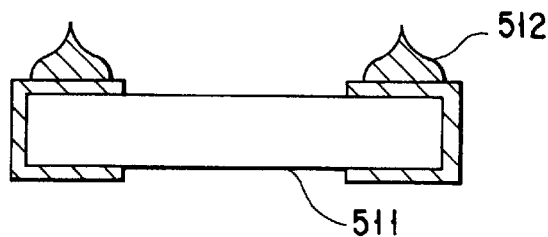
F I G. 6A
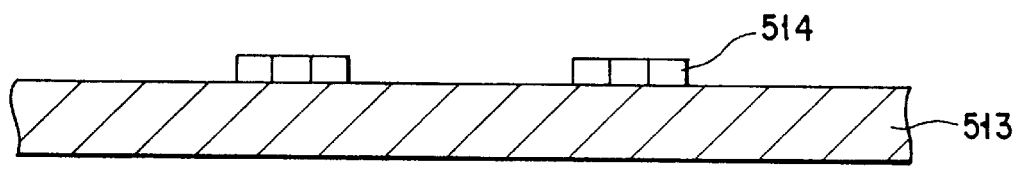
F I G. 6B
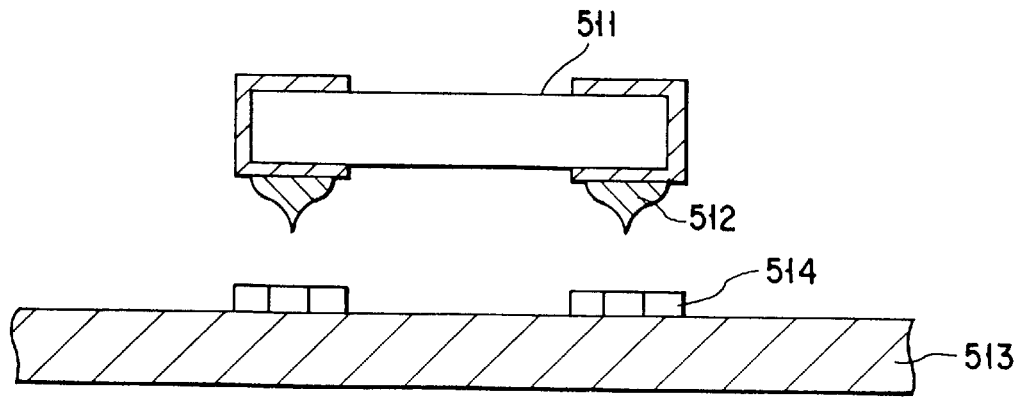
F I G. 6C

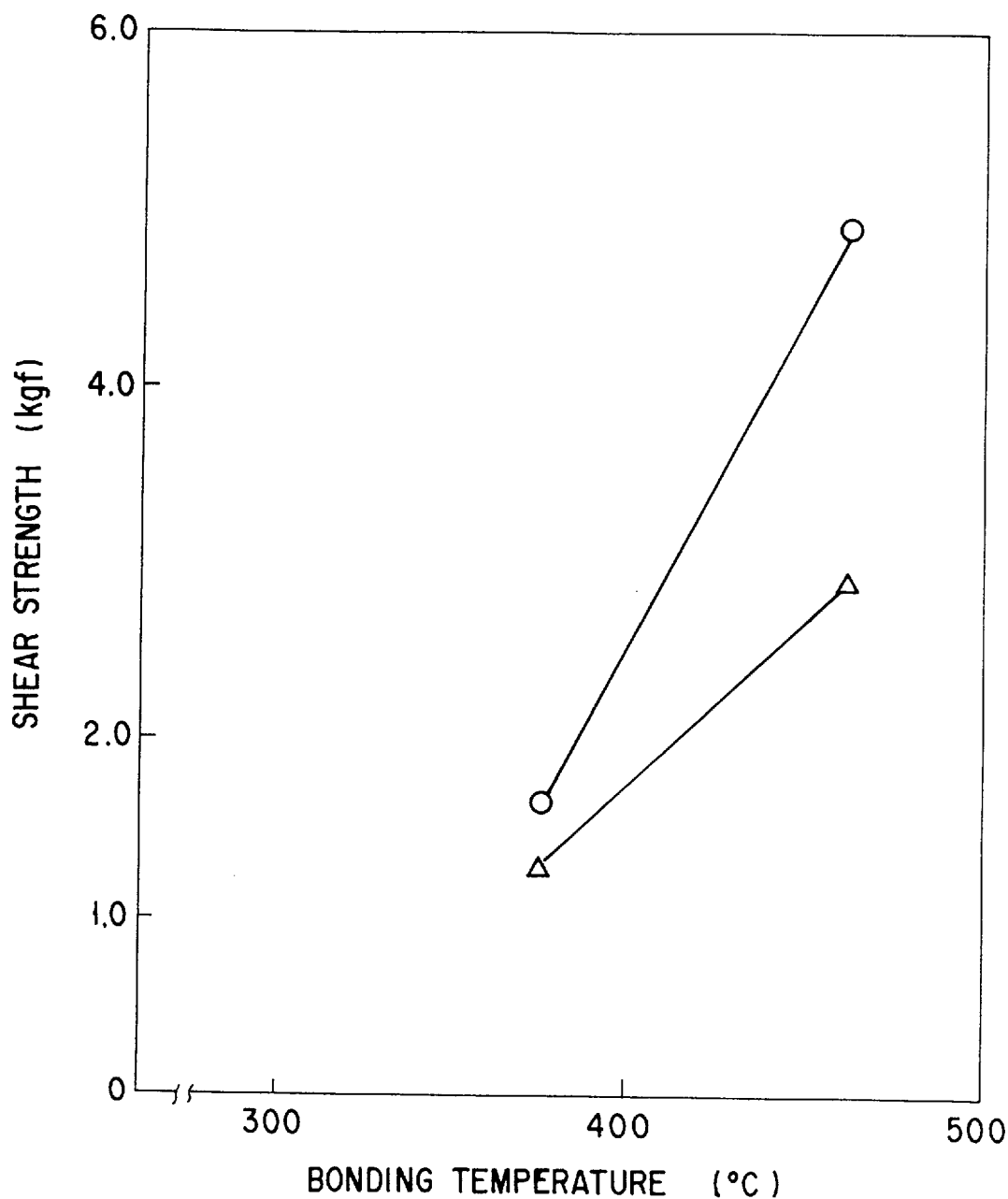
F I G. 7

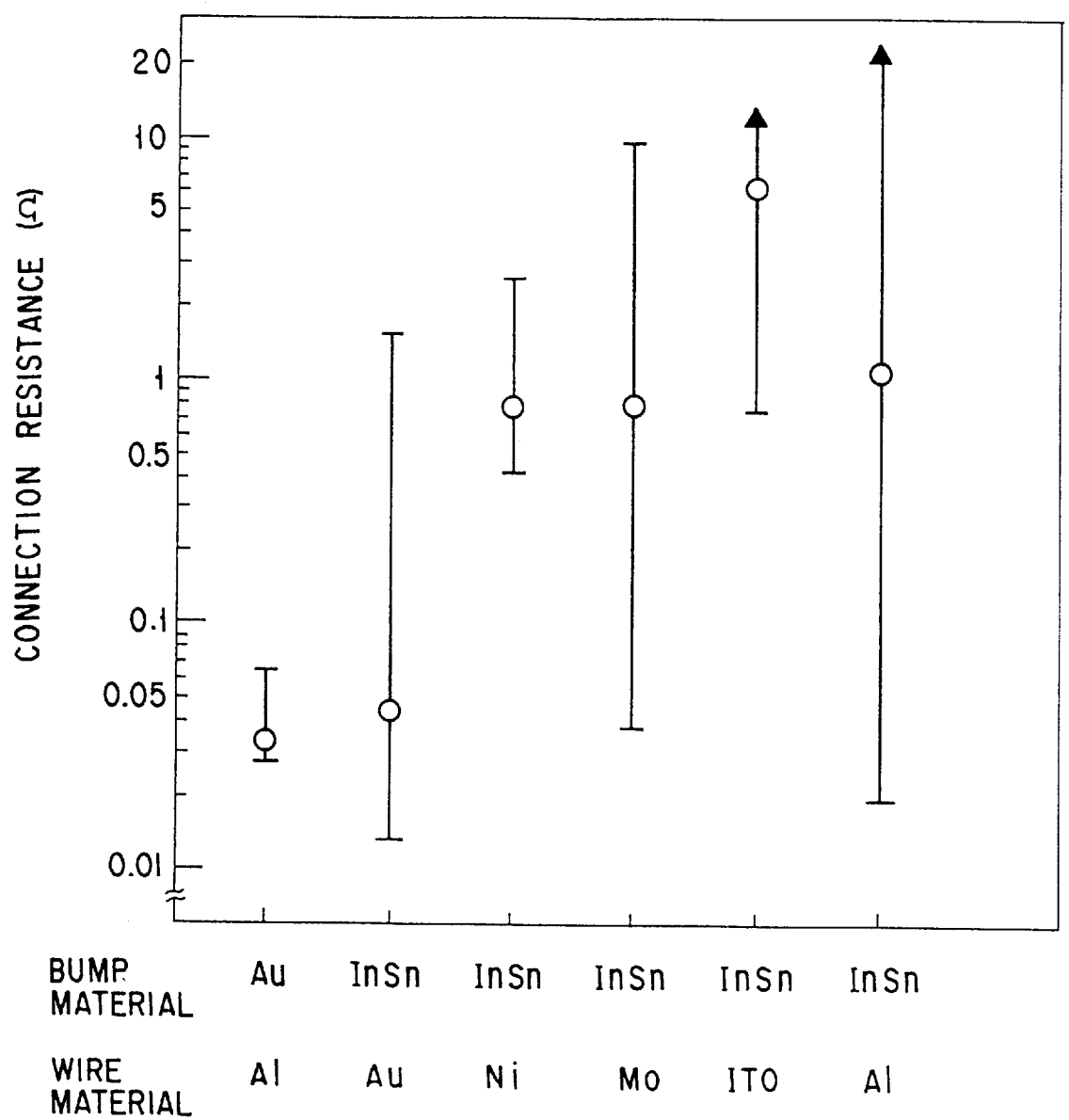
F I G. 8

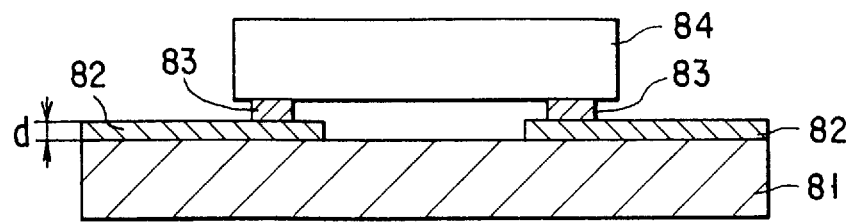
F I G. 21
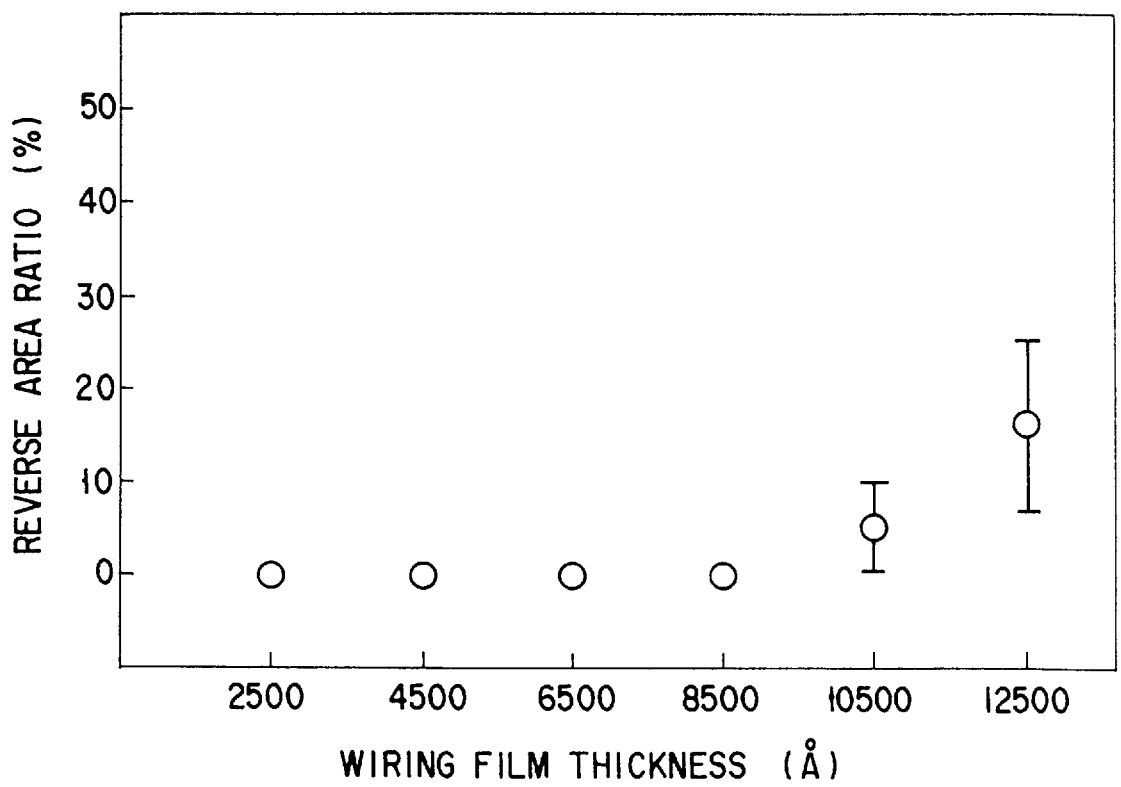
F I G. 22

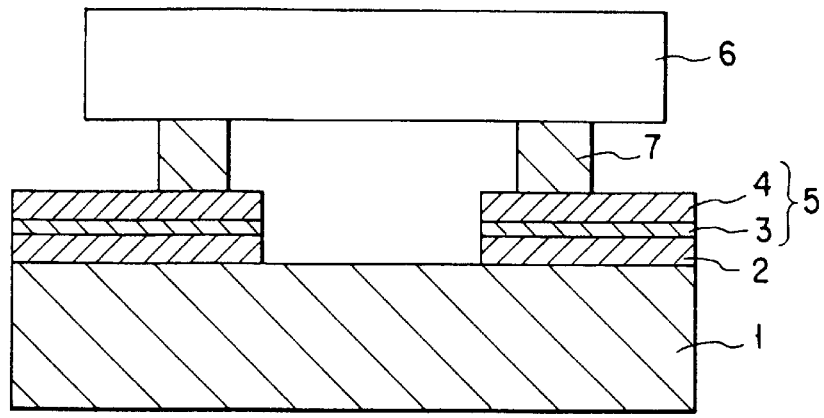
F I G. 23
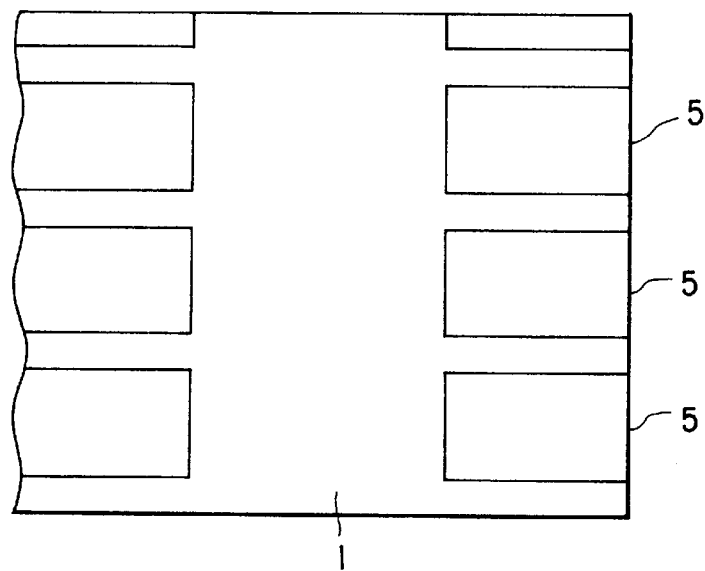
F I G. 24
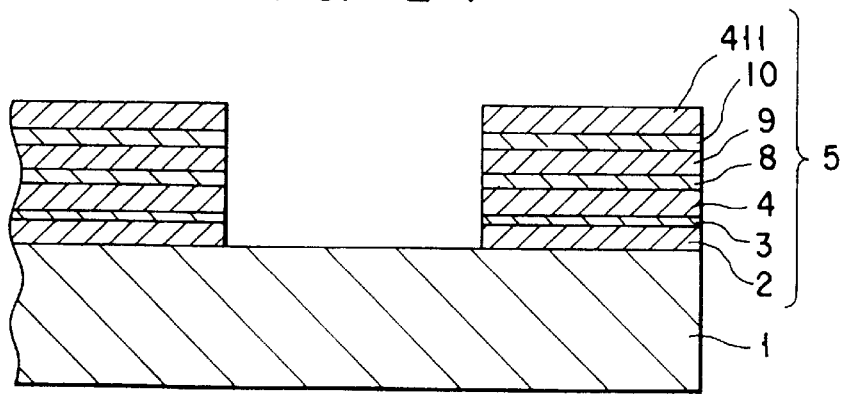
F I G. 25

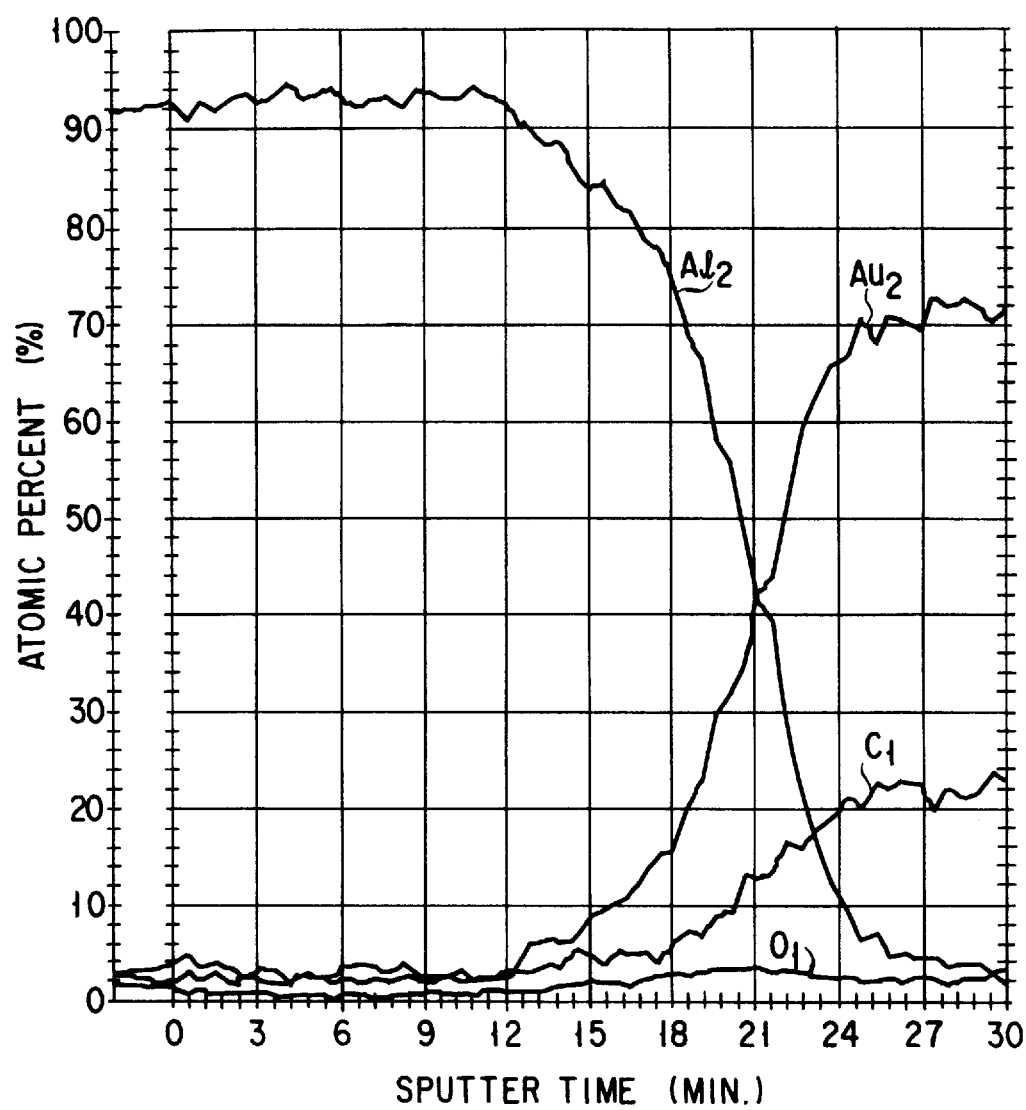
F I G. 30

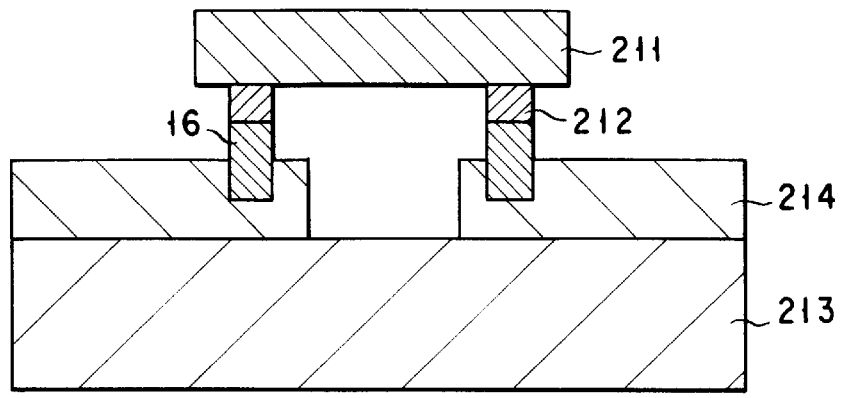
F I G. 33
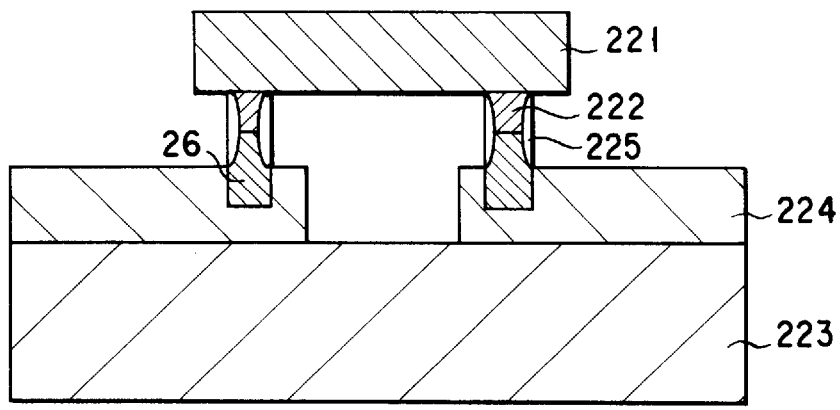
F I G. 35
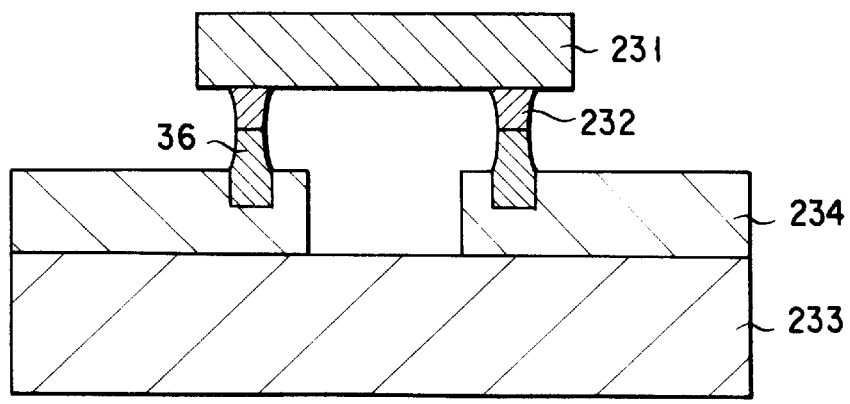
F I G. 37

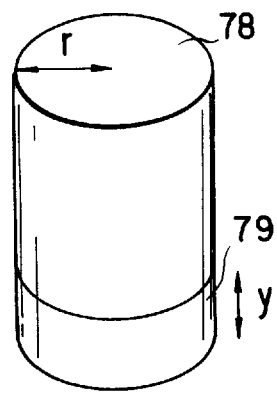
F I G. 39A
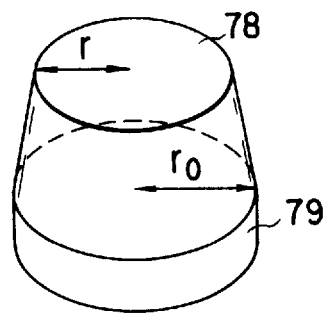
F I G. 39B
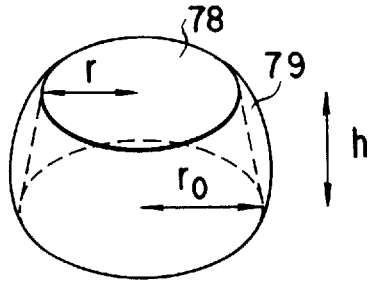
F I G. 39C

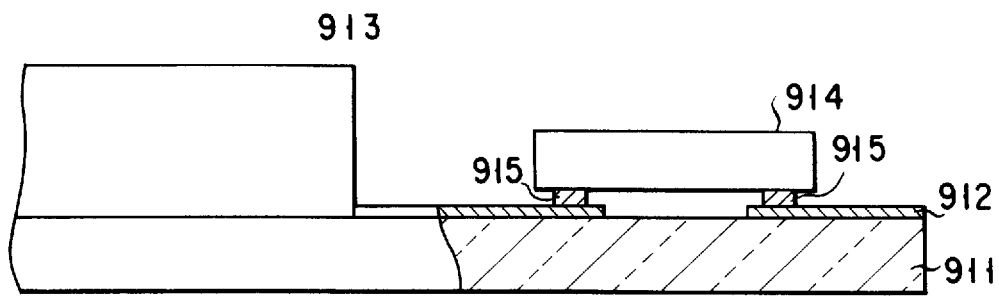
F I G. 42
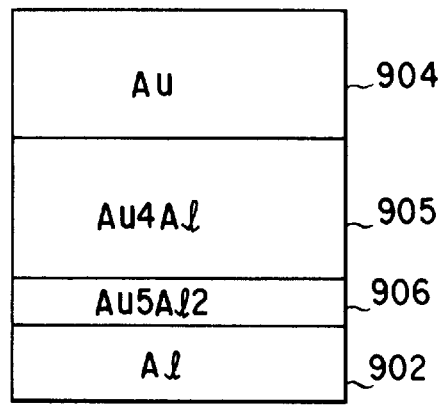
F I G. 43
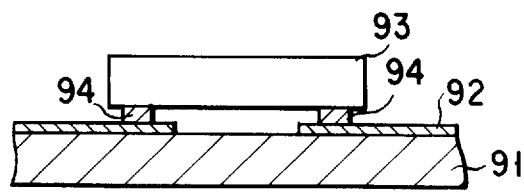
F I G. 49

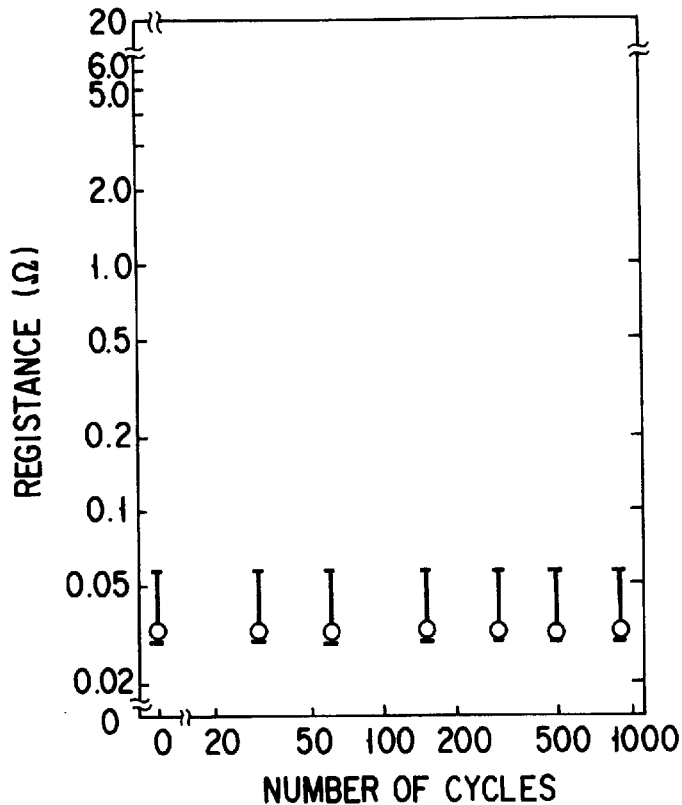
F I G. 45
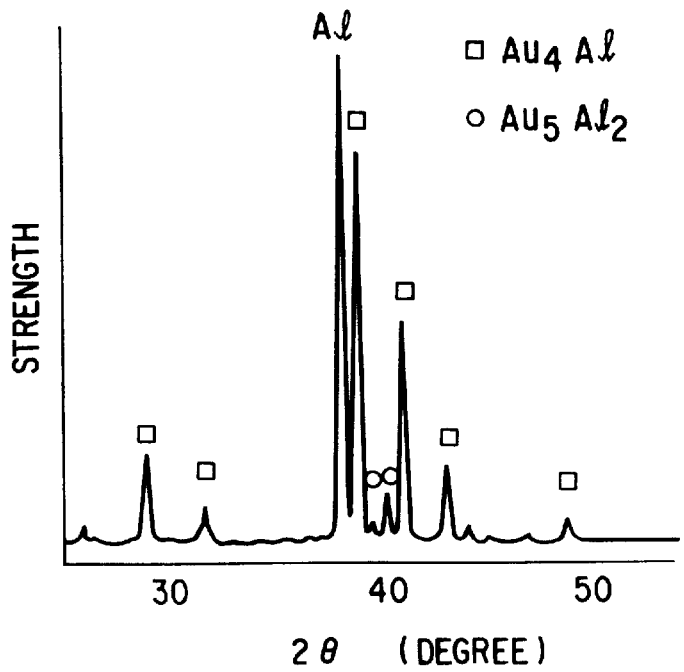
F I G. 46

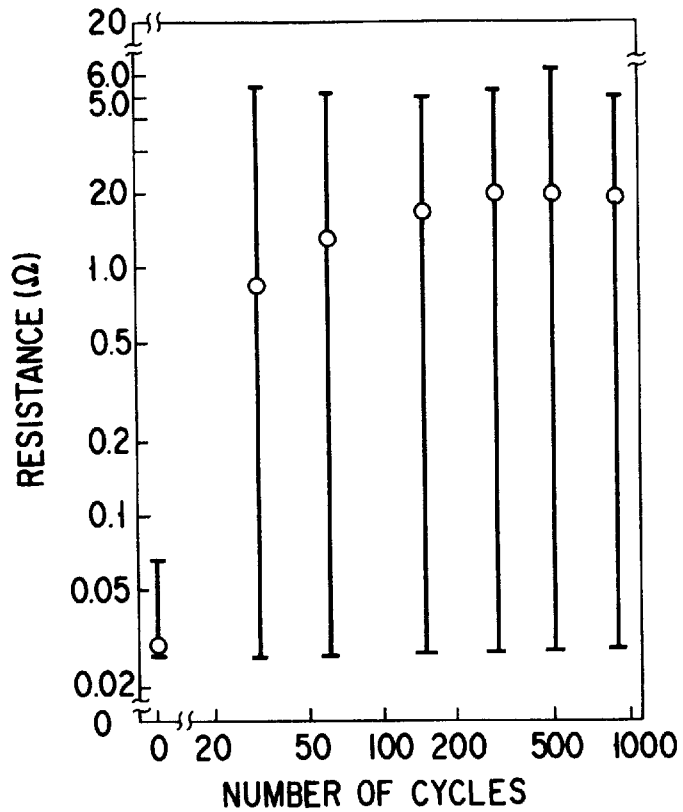
F I G. 47
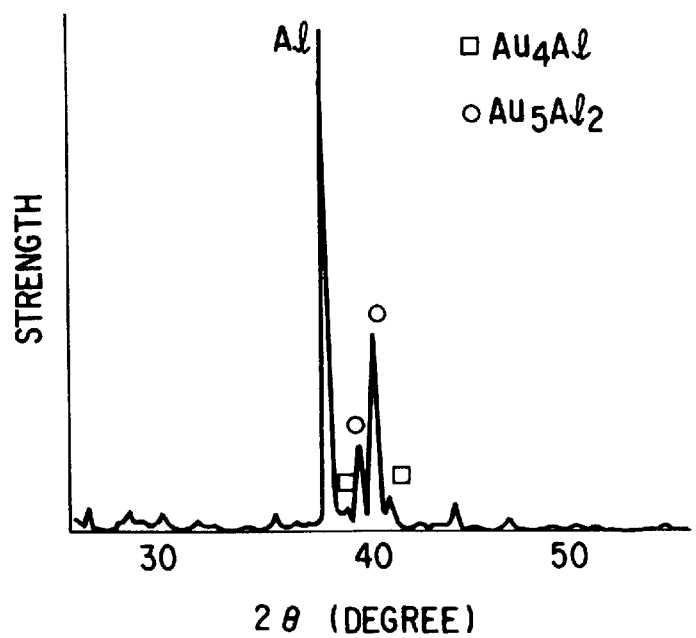
F I G. 48

ELECTRONIC CIRCUIT DEVICE

CROSS-REFERENCE TO THE RELATED APPLICATIONS

This application is a Continuation of application Ser. No. 08/493,530, now abandoned, filed on Jun. 22, 1995, which is a CIP of application Ser. No. 08/209,067, now abandoned, filed Mar. 11, 1994.

BACKGROUND OF THE INVENTION

1. Field of the Invention

The present invention relates to an electronic circuit device such as a semiconductor device or a flat display device and, more particularly, to an improvement of bonding between a passive chip element and a substrate.

2. Description of the Related Art

In recent years, to obtain a more compact, light-weight electronic circuit device, a method of mounting semiconductor elements and passive chip elements at a higher density to obtain a low-profile structure is proposed. Main conventional mounting methods are so-called wire-bonding mounting for placing a semiconductor element on a mounting substrate and electrically connecting the semiconductor element to the substrate through wires, fillet mounting for mounting passive chips filled with a filler therebetween on a mounting substrate, and the like.

A facedown mounting technique for forming bumps on a semiconductor element and connecting this element to a substrate through these bumps to mount the element is recently developed in place of the conventional mounting methods.

This facedown mounting technique has a higher manufacturing efficiency than that of wire-bonding mounting because the bonding operations can be performed at once. An example of the electronic circuit device obtained by this facedown mounting technique will be described below.

For example, FIG. 1A is a view for explaining fillet mounting, and FIG. 1B is a view for explaining bump mounting.

A passive chip element 104 is mounted on electrodes 102 on a substrate 101 through soldered portions 103. Reference numerals 105 denote electrodes of the passive chip element. Bump mounting can achieve high-density mounting due to the absence of fillets 100 extending outward from the passive chip element 104.

FIG. 2 is a schematic view of an electronic circuit device obtained when a package incorporating a semiconductor device is mounted in a ball grid array structure. As shown in FIG. 2, there is a ball grid array for connecting a ceramic substrate 112 having, e.g., a semiconductor element 110 thereon, to a substrate 116 through solder bumps 114.

A facedown mounting technique for forming bumps on a semiconductor element to mount it on a substrate is developed in place of a so-called semiconductor package obtained by resin-molding a semiconductor device. In particular, the developments of mounting techniques for flip chips have advanced. FIG. 3 is a view for explaining this flip-chip mounting technique. In flip chip mounting, as shown in FIG. 3, solder bumps 126 formed on a semiconductor element are reflowed to electrically and mechanically connect a semiconductor element 120 to wiring layers 124 on a substrate 122.

By all these methods, a solder is used as a connecting material and is melted to connect the passive chip element, the package, and the semiconductor element to the corresponding substrates.

A method of melting the solder may cause short-circuiting between adjacent elements due to the spread of the solder. For this reason, care must be taken for design of distances between the adjacent electrodes and between the passive chip elements, thereby avoiding a higher density.

In a liquid crystal display, a COG (Chip On Glass) mounting technique for mounting a chip on a glass substrate is available. In this liquid crystal display element, the chip faces down and is bonded on the glass substrate using bumps of chip. In general, the bumps are used to electrically connect the semiconductor element to a wiring layer formed on the glass substrate, and a resin is used to mechanically connect the semiconductor element to the glass substrate. One COG mounting technique is shown in FIG. 4. As shown in FIG. 4, a technique for performing initial connections is also proposed. Solder bumps 403 having a low melting point and a low hardness and formed on a semiconductor element 401 are brought into tight contact with wiring layers 404 formed on a substrate 402 to perform the initial connections without being through a connection resin. According to this method, the mechanical strength is low, and resin sealing is finally performed to assure the device reliability (Jpn. Pat. Appln. KOKAI Publication No. 3-108734). When the wiring layer on the substrate consists of a metal (e.g., aluminum) which tends to form a rigid oxide film, the wiring surface is covered with the oxide film at the time of connections. Although the connection between the wiring layer and the substrate is interrupted by the oxide film, this oxide film cannot be perfectly destroyed to degrade the connection reliability.

As a method of perfectly destroying an oxide film, a method of connecting a bump to an aluminum wiring layer through an anisotropic conductive film including fine conductive grains is available. According to this method, although the fine conductive grains are used to destroy the aluminum oxide film to connect the aluminum wiring layer to the bump, the fine conductive grains are used to perform only electrical connection and therefore has a small allowable current value and a high connection resistance. In addition precise connecting cannot be performed due to contact among the fine conductive grains. In this COG mounting, since electrical connection is achieved during hardening the resin, this makes it difficult to repair the resultant device if a defect is present.

On the other hand, a method of forming a solder bump, melting the solder bump, and alloying it with the wiring layer on a substrate to achieve electrical connection is available as in flip-chip mounting. When a wiring layer consists of a metal such as aluminum having poor wettability with a solder, satisfactory connection cannot be achieved.

As described above, the conventional methods have failed to obtain an electronic circuit device having a sufficiently electrical connection and a high allowable current density.

Conventional mounting of an electronic circuit device uses a solder which is then melted to achieve electrical connection. For this reason, when the solder is melted and bonded, the solder may be deformed and spreaded to cause short-circuiting between the adjacent electrodes. For this reason, the distance between the adjacent electrodes and the distance between the passive chip elements or semiconductor elements must be designed with a sufficient margin in consideration of the spread of the solder, thereby avoiding a higher density.

SUMMARY OF THE INVENTION

It is an object of the present invention to provide an improved packaged structure mounted with an electronic circuit device, wherein substrates are respectively connected to a passive chip element, a package, and a semiconductor element through bumps at a high density to obtain a high connection strength, a high allowable current density, a low connection resistance, and highly reliable connection.

According to the first aspect of the present invention, there is provided an electronic circuit device comprising:

a substrate;

a wiring layer formed on a surface of the substrate and essentially consisting of at least one metal selected from the group consisting of gold, copper, tin, and aluminum;

bump-like bonding means formed on the wiring layer and essentially consisting of at least one metal selected from the group consisting of gold, copper, and aluminum; and a micro electronic element formed on the bonding means, wherein solid-phase diffusion bonding is performed at least either between the wiring layer and the bonding means or between the bonding means and an electrode of the micro electronic element.

The second aspect of the present invention is a preferable example of the first embodiment and provides a semiconductor device comprising:

a wiring layer formed on an insulating substrate and essentially consisting of at least one metal selected from the group consisting of gold, copper, tin, and aluminum;

bump-like bonding means bonded to a surface of the wiring layer by solid-phase diffusion and essentially consisting of at least one metal selected from the group consisting of gold, copper, and aluminum; and a semiconductor element formed on the bonding means.

The third aspect of the present invention is another preferable example of the first embodiment and provides a liquid crystal display device comprising:

a pair of substrates;

a liquid crystal sandwiched between the pair of substrates;

a wiring layer formed on one of the pair of substrates and having a thickness of 3,000 Å to 8,500 Å, the wiring layer including a top layer having a thickness of 2,500 Å to 8,000 Å and containing aluminum as a main component;

bump-like bonding means bonded on the top layer by solid-phase diffusion; and a semiconductor element formed on the bonding means.

According to the fourth aspect of the present invention, there is provided a circuit substrate comprising a substrate, and a multilayered wiring layer constituted by a first metal layer formed on the substrate, an oxide film formed on the first metal layer and consisting of the same metal as that of the first metal layer, and a second metal layer formed on the metal oxide film and consisting of a metal as in the first metal layer.

The multilayered layer can be used in a variety of applications as wiring layers used in the first to third aspects of the invention.

In addition, according to the fifth aspect of the present invention, there is provided a circuit substrate comprising a substrate, a wiring pattern formed on the substrate, and first and second pad arrays formed on the wiring pattern, wherein the first and second pad arrays are defined such that a central coordinate position of the second pad array is defined as (xi+j,yi+k) (i=1 to n; j and k are moving distances) when a central coordinate position of the first pad array is defined as (xi,yi) (i=1 to n).

This wiring pattern can also be used in a variety of applications as the wiring layers of the first to third embodiments.

According to the sixth aspect of the present invention, there is provided a micro electronic circuit device comprising:

an insulating substrate;

a wiring layer formed on the insulating substrate and containing aluminum;

bump-like bonding means bonded to a surface of the wiring layer by forming a solid solution by solid-phase diffusion and essentially consisting of at least one metal selected from the group consisting of gold, silver, copper, platinum, palladium, nickel, iridium, rhodium, and aluminum; and a micro electronic element formed on the bonding means.

According to the seventh aspect of the present invention, there is provided a method of manufacturing a semiconductor device, comprising the steps of:

forming a repair functional layer containing a low-melting-point bonding metal on at least one of an aluminum-containing wiring layer formed on an insulating substrate and gold-containing bonding means formed on a flip-chip semiconductor element;

aligning the aluminum-containing wiring layer with the gold-containing bonding means through the repair functional layer;

heating the aluminum-containing wiring layer and the gold-containing bonding means to a temperature not more than a melting point of the low-melting-point bonding metal to perform tentative bonding; and performing solid-phase diffusion between the aluminum-containing wiring layer and the gold-containing bonding means to form a reaction layer, thereby performing main bonding.

According to the eighth aspect of the present invention, there is provided a semiconductor device comprising:

an insulating substrate;

a wiring layer formed on the insulating substrate and essentially consisting of a metal alloy of the first metal of at least one material selected from the group consisting of gold, copper, tin, and aluminum, and the second metal of at least one material selected from the group consisting of molybdenum, tungsten, and tantalum;

bump-like bonding means which is bonded to a surface of the wiring layer by forming a reaction layer by a solid-phase diffusion reaction and essentially consists of at least one metal selected from the group consisting of gold, silver, copper, nickel, palladium, and platinum; and a semiconductor element formed on the bonding means.

According to the ninth aspect of the present invention, there is provided an electronic circuit device comprising:

a substrate;

an aluminum-containing wiring layer formed on the substrate;

bump-like gold-containing bonding means bonded on the wiring layer by forming a reaction layer containing an intermetallic compound by solid-phase diffusion; and a micro electric element formed on the bonding means, wherein the intermetallic compound has a highest $Au_4Al$ content.

According to the first to third aspects of the present invention, bumps are used to perform bonding at once. According to the present invention, solid-phase diffusion bonding is applied to at least between the wiring layer and the bonding means or between the bonding means and the electrode of the micro electronic element. Unlike the solder, a material used in this bonding can provide a high connection strength, a high allowable current density, a low connection resistance, and highly reliable connection. As described above, according to the present invention, the bump is combined with solid-state diffusion bonding to achieve the above object.

According to the fourth and fifth aspects of the present invention, if a mounted element should become a defective element during the manufacturing process of each electronic circuit device described above, the repairing operation for replacing the defective element with another nondefective element can be facilitated to achieve highly reliable connection.

According to the sixth aspect of the present invention, the wiring layer is limited to an aluminum-containing material, and a solid solution and/or an amorphous alloy is formed between the wiring layer and selected bonding means by solid-phase diffusion to provide a low connection resistance and highly reliable connection.

According to the seventh aspect of the present invention, the wiring layer is tentative connected to the bonding means through the repair functional layer to enable an electrical test. If any defective connection is present, the defective portion can be easily peeled at the repair functional layer to perform a repairing operation. Upon completion of the repairing operation, electrical and mechanical connections are performed in main bonding. In this manner, the two-stage connection method makes a repairing operation of a semiconductor device easily, thereby obtaining a highly reliable semiconductor device.

According to the eighth aspect of the present invention, the wiring layer uses a metal which tends to be alloyed with the bonding means by solid-phase diffusion, and a metal which is hard to be alloyed. This structure can decrease the mechanical strength of the reaction layer between the bonding means and the wiring layer by solid-phase diffusion, facilitating repairing.

According to the ninth aspect of the present invention, the wiring layer is limited to an aluminum-containing material, and the bonding means is limited to a gold-containing material. In addition, the reaction layer containing intermetallic compound is formed by solid-phase diffusion and limited to a specific composition. Therefore, cracks on a connected portion caused by thermal shock can be prevented to avoid degradation of a liquid crystal of a micro electric element unit and obtain highly reliable connection.

Note that solid phase diffusion bonding according to the invention produces a reaction layer comprising metal alloys such as an intermetallic compound, a solid solution, an amorphous alloy, and an eutectic alloy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 5 is a sectional view showing part of an electronic circuit device according to the first aspect of the present invention;

FIGS. 6A to 6C are views showing the steps in manufacturing the electronic circuit device shown in FIG. 5;

FIG. 7 is a graph showing the shear strengths of a chip and a substrate as a function of chip temperature;

FIG. 8 is a graph showing the connection resistance as a function of the bump/wire material;

FIG. 21 is a schematic view showing a liquid crystal display device according to the third embodiment of the present invention;

FIG. 22 is a graph showing the relationship between a wiring film thickness and a reverse area ratio in the liquid crystal display device according to the third embodiment of the present invention;

FIG. 23 is a side view a state in which a semiconductor element is mounted on a circuit substrate as an example of the fourth embodiment of the present invention;

FIG. 24 is a plan view of FIG. 23;

FIG. 25 is a side view showing a state in which a semiconductor element is mounted on a circuit substrate as another example of the fourth embodiment of the present invention;

FIG. 30 is a graph showing the model of a composition on a gold/aluminum interface according to the sixth embodiment of the present invention;

FIG. 33 is a sectional view showing part of the first example of a semiconductor device according to the seventh embodiment of the present invention;

FIG. 35 is a sectional view showing part of the second example of a semiconductor device according to the seventh embodiment of the present invention;

FIG. 37 is a sectional view showing part of the third example of a semiconductor device according to the seventh embodiment of the present invention;

FIGS. 39A to 39C are views of models for calculating a preferable maximum value of a low-melting-point bonding metal layer;

FIG. 42 is a view for explaining a liquid crystal display device according to the ninth embodiment of the present invention;

FIG. 43 is a schematic view showing intermetallic compounds according to the ninth embodiment of the present invention;

FIG. 45 is a graph showing a relationship between the number of cycles and a resistance, relating to a thermal shock test after bonding at high temperature, of an example of the liquid crystal display device according to the ninth embodiment of the present invention;

FIG. 46 is a graph of the X-ray diffraction analysis of the example of the liquid crystal display device according to the ninth embodiment of the present invention;

FIG. 47 is a graph showing a relationship between the number of cycles and a resistance, relating to a thermal shock test after bonding at low temperature of a comparative example of a liquid crystal display device according to the ninth embodiment of the present invention;

FIG. 48 is a graph of the X-ray diffraction analysis of the comparative example of the liquid crystal display device according to the ninth embodiment of the present invention; and FIG. 49 is a sectional view showing an application of the ninth embodiment of the present invention.

DETAILED DESCRIPTION OF THE PREFERRED EMBODIMENTS

Figure 1A:
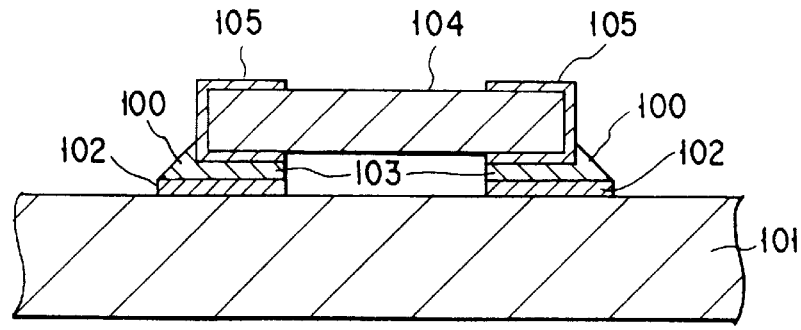
FIG. 1A is a schematic view showing a conventional electronic circuit device.
Figure 1B:
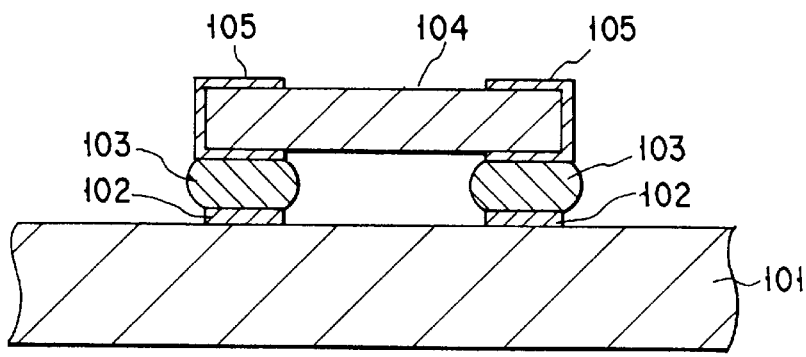
FIG. 1B is a schematic view showing another conventional electronic circuit device.
Figure 2:
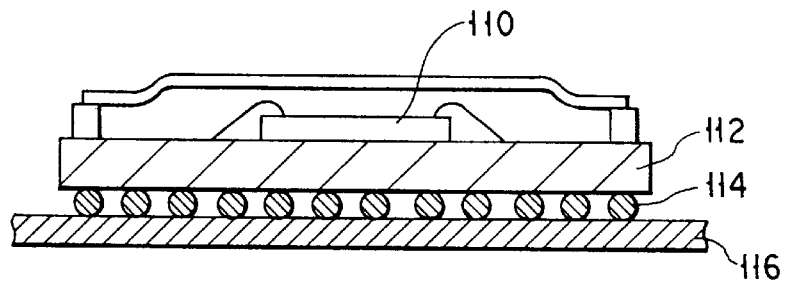
FIG. 2 is a schematic view showing still another conventional electronic circuit device.
Figure 3:
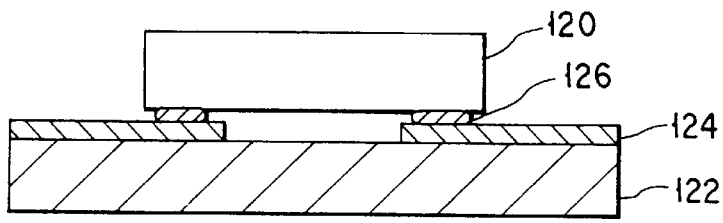
FIG. 3 is a schematic view showing still another conventional electronic circuit device.
Figure 4:
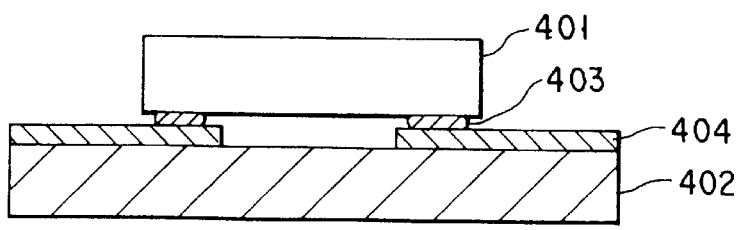
FIG. 4 is a view for explaining a conventional liquid crystal display device.

The present invention mainly has nine embodiments.

According to each of the first to third embodiments of the present invention, there is provided an electronic circuit device, in which solid-phase diffusion bonding is performed at least between a wiring layer and a bump or between the bump and, e.g., a passive chip element, a package incorporating a semiconductor element, or the electrode of a micro electronic element such as a semiconductor element or a liquid crystal display element.

According to each of the fourth and fifth embodiments, a circuit substrate having a multilayered wiring layer can be obtained. This circuit substrate facilitates a repairing operation during its manufacturing process to improve productivity and achieve highly reliable connection.

The techniques of the fourth and fifth embodiments can be preferably applied to the first to third embodiments.

According to the sixth embodiment, a solid solution and/or an amorphous alloy is formed in a bonded portion by solid-phase diffusion.

The seventh to ninth embodiments of the present invention relate to a semiconductor device in which a reaction layer is formed in a bonded portion by solid-phase diffusion, a method of manufacturing a semiconductor device, and a liquid crystal display device.

The seventh embodiment of the present invention discloses a method of manufacturing a semiconductor device having a repair functional layer. According to the seventh embodiment, repairing of a bonded portion in which a reaction layer such as a solid solution and an intermetallic compound is formed by solid-phase diffusion can be facilitated to improve productivity and achieve highly reliable connection.

The eighth embodiment of the present invention discloses a semiconductor device in which repairing of a bonded portion is facilitated by improving the composition of a wiring layer.

According to the ninth embodiment of the present invention, the composition of an intermetallic compound included in a reaction layer is limited in an electric circuit device to prevent cracks in a connected portion caused by thermal shock and avoid degradation of a micro electronic element such as a liquid crystal of a display unit. Such a composition of the bonded portion can be applied to, e.g., the semiconductor device.

According to the first embodiment, there is provided an electronic circuit device comprising:

a substrate;

a wiring layer formed on a surface of the substrate;

bump-like bonding means formed on the wiring layer; and a micro electronic element formed on the bonding means, wherein solid-phase diffusion bonding is performed either between the wiring layer and the bonding means or between the bonding means and an electrode of the micro electronic element.

According to the present invention, solid-phase diffusion bonding is defined such that both a metal A and a metal B are heated to temperatures below their melting points, and one of the metals in a solid-phase state is diffused in the other metal and bonded thereto, or that the metals in the solid-phase state are diffused to each other to achieve bonding. Solid-phase diffusion bonding produces alloys such as an intermetallic compound, a solid solution, or a eutectic alloy. At this time, when the metals A and B are bonded to each other under pressure during heating, even if an oxide film is formed on the metal A or B, the oxide film can be destroyed to allow rigid bonding. For example, a bump consists of gold and a wiring layer consists of aluminum, an intermetallic compound of gold and aluminum is formed. When the wiring layer consists of copper, a solid solution of gold and copper is formed. When the wiring layer consists of tin, a eutectic alloy of gold and tin is formed.

When metals to be bonded are metals A, diffusion occurs between the metals A at a temperature below the melting point of the metal A, thereby achieving bonding.

Unlike bonding using a solder, i.e., an In—Sn alloy as the bonding means with having the deformation as greater as 80–90%, the bonding means in "solid-phase diffusion" bonding is not melted, or the bonding means is not greatly deformed due to this melting.

The first embodiment of the present invention will be described with reference to the accompanying drawings.

FIG. 5 is a sectional view showing part of an electronic circuit device as an example of the first embodiment of the present invention. In this electronic circuit device, a passive chip element is used as a micro electronic element. The electronic circuit device is mainly arranged such that an insulating substrate having a wiring pattern on a surface thereof is connected to a passive chip element through a bump, wherein solid-phase diffusion bonding is performed at least between the wiring pattern and the bump or between the bump and the passive chip element. The passive chip element is a constituent element such as a capacitor, resistor, and inductor.

As shown in FIG. 5, in this electronic circuit device, a passive chip element 511 is connected to each wiring layer 514 through a corresponding gold bump (projection electrode) 512. In this case, the gold bump 512 is formed as a bonding means on an electrode of the passive chip element by a ball bonding method. The wiring layer 514 having the uppermost layer consisting of aluminum as a main component is formed on a substrate 513 consisting of a ceramic substrate. The gold bump 512 formed on the passive chip element 511 is bonded to aluminum of the wiring layer 514 by solid-phase diffusion bonding.

An example of the manufacturing process for realizing this electronic circuit device will be described below.

This manufacturing process includes the steps of: forming a wiring layer on an insulating substrate and arranging a passive chip element through a bump; and heating the bump and the wiring layer to temperatures below melting points thereof so as to bond the wiring layer and the bump by solid-phase diffusion.

FIGS. 6A to 6C are views showing an example of the manufacturing process of the electronic circuit device shown in FIG. 5.

As shown in FIG. 6A, the electrode portions of a passive chip element 511 which consist of tin are subjected to gold ball bonding to form gold bumps 512. At this time, gold and tin are connected to each other in a eutectic state.

As shown in FIG. 6B, wiring layers 514 each having a two-layered structure consisting of a lower tungsten layer and an upper aluminum layer are formed in desired regions on a ceramic substrate 513.

A stage (not shown) which supports the substrate 513 is heated to 375° C., a passive chip element suction head (not shown) is heated to 300° C., and the gold bumps 512 are aligned with the wiring layers 514 so as to perform bonding, as shown in FIG. 6C. The gold bumps 512 are brought into tight contact with the corresponding wiring layers 514 with a load of 50 gf/bump for 0.15 sec, thereby connecting the passive chip element 511 to the substrate 513.

In the resultant electronic circuit device, the aluminum oxide film spontaneously formed on the surface of the aluminum layer of each wiring layer 514 is destroyed when each gold bump is brought into contact with and pressed on the corresponding aluminum layer to achieve solid-state diffusion bonding, thereby obtaining rigid bonding. A semiconductor element having gold bumps formed in the same method as described above can also be brought into tight contact with the aluminum layers. Therefore, semiconductor elements and passive chip elements which are mounted by different conventional methods can be connected in the same bonding process.

In the above electronic circuit device, each gold bump is formed on the corresponding electrode of the passive chip element. However, a gold bump may be formed on an aluminum wiring layer by ball bonding. and the tin electrode of the passive chip element may be connected to the gold bump. The gold bump may be formed by plating, deposition, or transfer in addition to ball bonding. In case that a semiconductor element is used as a micro electronic element, when corrosion of a semiconductor element electrode. which is a factor for degrading the reliability of the semiconductor element, is taken into consideration together with use of a bare chip, a transfer bump may cause corrosion from a boundary between the bump and the electrode of the semiconductor element. Although the ball-bonding method is easy and flexible, a larger number of bumps undesirably cause to prolong the manufacturing time. Therefore, the number of bumps is small, the ball-bonding method is advantageous. However, when the number of bumps is large, a deposition or plating method is desirable.

In the above electronic circuit device, each bump is made of gold, the uppermost wiring layer consists of aluminum, and gold and aluminum are bonded by solid-phase diffusion. However, the present invention is not limited to this combination. Any combination can be used if materials are subjected to solid-phase diffusion. In addition, homogeneous materials such as a gold bump and a gold wiring layer can be bonded to each other. Combinations of the materials are exemplified as follows.

| Combinations | |
|---|---|
| Bump | Wiring Layer |
| Au | Au |
| Au | Al |
| Au | Cu |
| Au | Sn |
| Cu | Cu, Au, Sn |
| Al | Au, Sn, Al |

The present inventors compared the Au—Al combination of the above combinations with a conventional solder (In—Sn).

Test 1

Table 1 summaries the resistance shear strength, the initial connection probability, the maximum resistance, the minimum resistance, the average resistance, the number of measured bumps, the standard deviation σ, standard relative error σ/μ, and the hysteresis after the Au bump is bonded to the Al wiring layer by solid-phase diffusion. As comparative examples, similar values obtained from bonding between InSn bumps and Au, Mo, and Al wiring layers are also listed in Table 1.

bonding. When a cream solder is used, the shear strength is 3.5 kgf/mm$^2$ or more for a eutectic alloy, and the shear strength is 2.5 kgf/mm$^2$ for an 8% Bi-46% Sn—Pb solder. As compared with these values, the shearing strength characteristics of the Au/Al bump are found to be excellent.

As shown in Table 1, the maximum connection resistance is as low as 65 mΩ in solid-phase diffusion bonding (Au/Al). The relationship between the bump/wire material and the connection resistance is shown in FIG. 8. As can be apparent from this graph, the standard deviation is 5.4 mΩ, which

TABLE 1

| Bonded Surface | Solid-Phase Diffusion Bonding | In/Sn Bump Compression Bonding | | |
|---|---|---|---|---|
| | Au/Al | InSn/Au | InSn/Mo | InSn/Al |
| Resistance Shear Strength (Kgf) | 2.7 | 1.0 | 0.4 | 0.4 |
| Initial Connection Probability | | | | |
| Maximum Resistance (Ω) | 0.065 | 1.55 | 9.09 | 12.1 |
| Minimum Resistance (Ω) | 0.027 | 0.013 | 0.036 | 0.018 |
| Average Resistance (Ω) | 0.033 | 0.043 | 0.78 | 1.01 |
| No. of Measured Bumps | 924 | 1045 | 2090 | 760 |
| Standard Deviation σ (Ω) | 5.42 × 10$^{-3}$ | 0.067 | 0.97 | 1.37 |
| Standard relative error σ/μ | 0.16 | 1.56 | 1.25 | 1.35 |

FIG. 7 shows the relationship between the shear strengths of a chip and a substrate as a function of chip temperature wherein 146 of bumps are in one chip, and the size of the bump is 75×55 μm and a bonding load as a parameter. The average shear strength is about 2.7 kgf/a chip (4.5 kgf/mm$^2$), the minimum shear strength is about 1.3 kgf/a chip (2.2 kgf/mm$^2$), and the maximum shear strength is about 4.9 kgf/a chip (8.1 kgf/mm$^2$). In the conventional In/Sn bump compression bonding, 400 gf and 380 gf are obtained for Al and Mo, respectively. Therefore, the shear strength of this embodiment is higher than that of the conventional bonding by several times.

Breaking upon shearing occurred between the InSn bumps and the wiring layers in all samples obtained in InSn bump compression bonding, and the reaction traces showing the solid-phase diffusion at the rupture cross-section was not confirmed. In solid-phase diffusion bonding between the Au bump and the wiring layer, breaking upon shearing occurred in a variety of regions, e.g., in chip Si, between Si and Al pads, and between an Al pad and a barrier metal, between a barrier metal and an Au bump, between an Al bump and an Al wiring layer, between an Al wiring layer and a glass substrate, and in a glass substrate. It appears that bondings between Al bump and Al wiring strong and the other bonding among Si chip/Al/brierr metal and Au/bump/Al wiring/Al wiring, expectively, is similar to each other. In a breaking mode between the Al bump and the Al wiring layer, a reaction spot was confirmed on the Al wiring layer. This reaction spot is as a solid-phase diffusion spot of Au/Al as in Au/Al wire bonding. According to the report by Iwata et al., the shear strength in this wire bonding is 8.9 kgf/mm$^2$. When a calculation is performed so as to correspond to this value, the shear strength of an IC chip (146 Au bumps each having a size of 55×75 μm) used by the present inventors becomes 5.4 kgf. This shear strength is lower than that in Au/Al wire bonding. However, an Au ball in this wire bonding is subjected to plastic deformation by about 40%. For this reason, when a small deformation in the Au bump in the present invention due to a weak bonding load is taken into consideration, the shear strength (5.4 kgf) characteristics of the present invention are not inferior to those in ball indicates small variations in resistance. In this manner, solid-phase diffusion bonding apparently provides stabler connection than In/Sn bump compression bonding.

Figure 10:
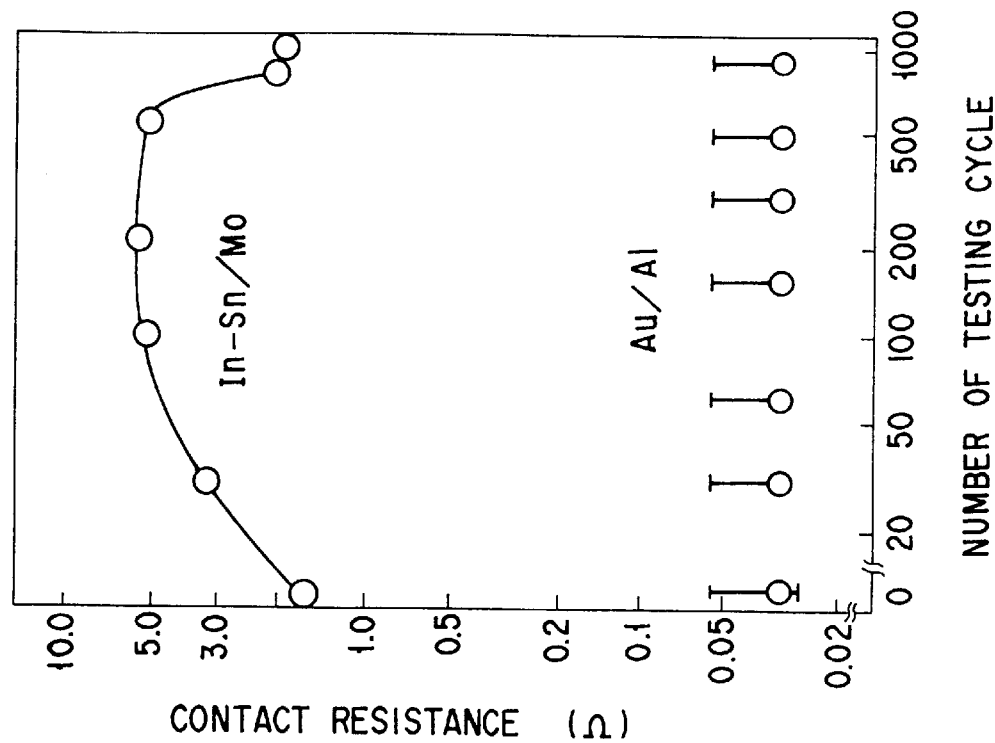
FIG. 10 is a graph showing TST results.
Figure 9:
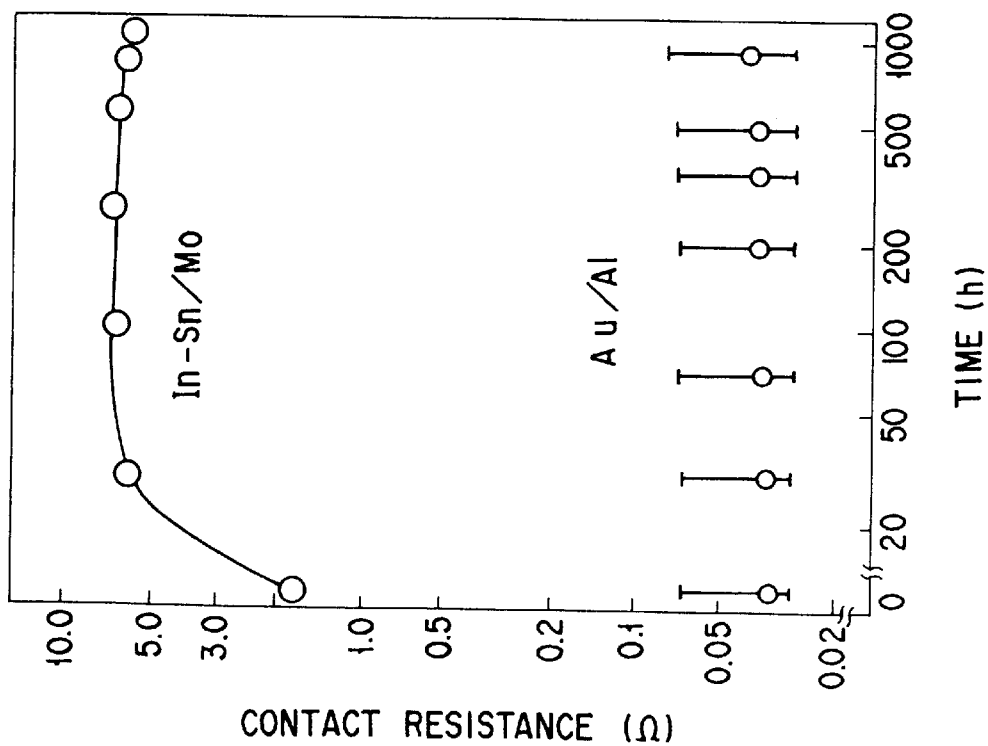
FIG. 9 is a graph showing high-temperature, high-humidity test results.

The present inventors conducted a high-temperature, high-humidity test at 70° C., 90% R.H., for 1,000 hours and a TST (Thermal Shock Test) at −40° C. and 100° C. for 30 minutes, respectively, 1000 cycles with regard to Au/Al solid-state bonding and InSn/Mo compression bonding. FIG. 9 is a graph showing the results of the high-temperature, high-humidity test, while FIG. 10 is a graph showing the TST results. As can be apparent from these graphs, the resistance is high and greatly varies in compression bonding using the solder. However, in solid-phase diffusion bonding, the variations in resistance are reduced as compared with compression bonding, and a low resistance can be apparently maintained.

The solder is too soft, flexible, and deformable to perform bonding at a temperature below its melting point. For this reason, the solder is generally connected by an anchor effect. As described above, the solder has a low connection strength and variations in resistance, and cannot be connected to Al because an oxide film on the surface of Al cannot be destroyed. In addition, the solder itself has a low strength and poor reliability.

Figure 11:
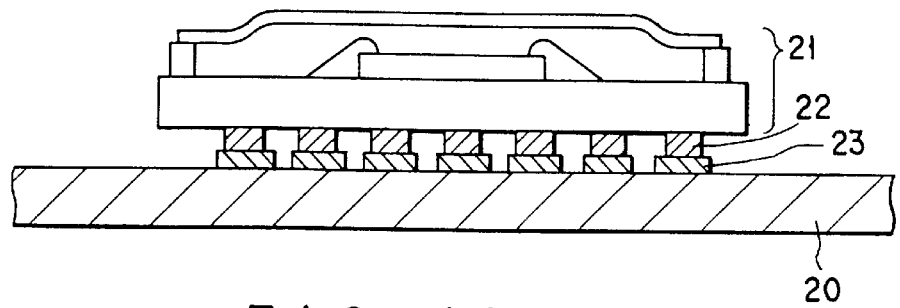
FIG. 11 is a view showing another example of the first embodiment of the present invention.

FIG. 11 is a view showing another example of the first embodiment of the present invention. This electronic circuit device uses a package incorporating a semiconductor element as a micro electronic element. The electronic circuit device is mainly arranged such that an insulating substrate having a wiring pattern on a surface thereof is connected to the package incorporating the semiconductor element through bumps, wherein solid-phase diffusion bonding is performed at least between the wiring pattern and the bump or between the bump and the electrode of the package.

As shown in FIG. 11, wiring layers 23 each constituted by a multilayered structure in which titanium, nickel, and gold are stacked in turn by sputtering in an order named on an alumina substrate 20 are used. Gold bumps 22 formed by plating or the like on the electrodes of the package 21 incorporating the semiconductor substrate are connected to the wiring layers 23. The gold bumps 22 of the package 21 are bonded to gold of the wiring layers 23 by solid-phase diffusion. An example of the manufacturing process for realizing this electronic circuit device will be described below.

Titanium, nickel, and gold are sputtered on the package 21 to form the electrode. Resist coating, patterning, electroplating, and the like are performed to form the gold bumps 22. A stage (not shown) which supports the substrate 20 is heated to 300° C., a head (not shown) which chucks the package is heated to 370° C., and compression bonding is performed with a load of 50 gf/bump for 0.15 sec to connect the package 21 to the substrate 20.

In the resultant electronic circuit device, the wiring layer 23 having the uppermost gold layer is bonded to the corresponding gold bump 22 by solid-phase diffusion, thereby obtaining rigid bonding.

Figure 12:
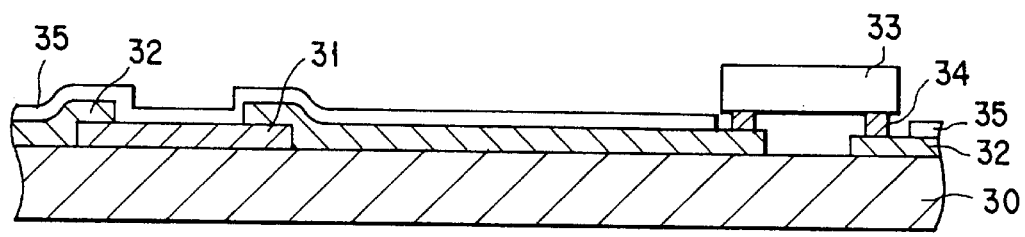
FIG. 12 is a view showing another example of the first embodiment of the present invention.

FIG. 12 is a view showing still another example of the first embodiment of the present invention. In this electronic circuit device, an aluminum wiring is formed on an insulating substrate used in this device and can be used as a printing head. The electronic circuit device having this printing head comprises a substrate having resistance (heat generator) a wiring layer formed on the substrate and including a top layer containing aluminum as a main component, a bump bonded to the top layer by solid-phase diffusion bonding, and a semiconductor element mounted through the bump, wherein the thickness of the aluminum layer is 2,500 Å to 15,500 Å, and the thickness of the wiring layer is 3,000 Å to 1,6000 Å.

As shown in FIG. 12, in this electronic circuit device, an alumina substrate 30 is used as a ceramic substrate. A resistor 31 and wiring layers 32 are formed on this alumina substrate 30 by sputtering to constitute a printing head. Bumps 34 are formed on a drive semicon-ductor element 33 is connected through these bumps 34 by solid-phase diffusion. Reference numerals 35 denote protective layers.

More specifically, in this printing head, the gold bumps 34 formed on the electrodes of the semiconductor element 33 by electroplating or the like are connected to aluminum wiring layers 32 formed on the alumina substrate 30. That is, the bumps 34 on the semiconductor element 33 are connected to the wiring layers 32 by solid-phase diffusion. Such printing head can be used as an element of a printer. In this embodiment, the thickness of each aluminum layer was 8,000 Å and each gold bump had a size of 30 μm□. The bump pitch was 40 μm, and the number of bumps was 146. The semiconductor element was heated to 400° C., the substrate was heated to 80° C., and compression bonding was performed with 25 gf/bump for 0.2 sec to cause a solid-phase diffusion reaction, thereby bonding the gold bumps to the wiring layers. The adhesion strength between the semiconductor element and the substrate upon bonding was 4.0 kgf, which was a sufficiently high strength. The contact resistance was 20 to 30 mΩ/bump. The resultant sample was subjected to a high-temperature, high-humidity test (70° C., 90% R.H, 1,000 hours), and a thermal shock test (−40° C./100° C., 30 min/30 min, 1,000 cycles). Variations in contact resistance fell within the range of +10%, and it is thus found that stable electrical connection is achieved.

The adhesion strength between the semiconductor element 33 and the substrate 30 is evaluated under the above environmental conditions. The adhesion strength varied within about 10% with respect to the initial strength of 4.0 kgf, thus obtaining a satisfactory level in practical use.

A modification of the electronic circuit device having the above printing head will be described below. In this device, each wiring layer 32 was formed so that the aluminum layer had a thickness of 15,500 Å, thereby obtaining an electronic circuit device in the same manner as in the electronic circuit device having the above printing head. This sample was tested following the same procedures as described above. The adhesion strength between the semiconductor element and the substrate upon bonding was 4.0 kgf, and a sufficiently high strength was maintained. The contact resistance was 20 to 30 mΩ/bump. A high temperature test (70° C., 90% R.H., 1,000 hours) and a thermal shock test (−40° C./100° C., 30 min/30 min, 1,000 cycles) of this sample were conducted, and the variations in contact resistance fell within the range of ±10%, thus achieving stable electrical connection.

The adhesion strength between the semiconductor element 33 and the substrate 30 was evaluated under the same environmental conditions as described above in a shear test. Variations in adhesion strength fell within the range of about 10% with respect to the initial strength of 4.0 kgf, thereby obtaining a satisfactory level in practical use. No degradation in printing precision occurred.

COMPARATIVE EXAMPLE 1

A sample was prepared as a comparative example of the electronic circuit device having a printing head, except that the thickness of an aluminum layer was 2,000 Å. The same tests as described above were conducted for this sample. The adhesion strength between the semiconductor element and the substrate upon bonding was 0.9 kgf, which posed a problem in which the semiconductor element peeled off from the substrate soon. The intermetallic compound of aluminum and gold reaches below the aluminum wiring layer due to the decrease in adhesion strength.

COMPARATIVE EXAMPLE 2

A sample was prepared as another comparative example except that the thickness of an aluminum layer was set to 20,000 Å. The same tests as described above were conducted for this sample. The adhesion strength and contact resistance between the semiconductor element and the substrate upon bonding, and variations in contact resistance had satisfactory levels in practical use. However, printing precision was greatly degraded as compared with the aluminum film thickness of 15,500 Å.

An electronic circuit device in which a printing head is bonded using bumps by solid-phase diffusion will be taken into consideration.

When the thickness of an aluminum layer as the uppermost layer of the multilayered wiring layer formed on a ceramic substrate is not more than 2,500 Å, and the bump material consists of gold, an intermetallic compound of gold and aluminum, which compound serves as a solid-phase diffusion layer, reaches below the aluminum layer to greatly degrade the adhesion between the solid-phase diffusion layer and the underlying layer or substrate. Cracking, peeling, and the like tend to occur. On the other hand, when the thickness of the aluminum layer increases, the total thickness of the wiring layer increases to cause degradation in printing quality.

In consideration of the above problems, the present inventors optimized the thickness of the aluminum layer when a semiconductor element is mounted on a ceramic substrate constituting a printing head by utilizing metal solid-phase diffusion. The present inventors examined the relationship between growth of the inter-metallic compound of aluminum and gold and the thickness of the aluminum layer.

As a result, when the thickness of the aluminum layer was smaller than 2,200 Å in heating at 400° C. for 0.2 sec, the solid-phase diffusion layer consisting of the intermetallic compound of aluminum and gold was found to be produced below the lower layer of the multi-layered wiring layer, and cracking and peeling tended to occur. As a result of an experiment, the solid-phase diffusion layer of gold and aluminum is formed to a depth of about 2,200 Å from the boundary between the gold bump and the aluminum layer. It was found that the thickness of the solid-phase diffusion layer varied in the range of 1,900 Å to 2,500 Å due to factors such as variations in heights of gold bumps and the inclination of a jig for bonding the semiconductor element. Therefore, the thickness of the aluminum layer is found to be at least 2,500 Å so as to cause the aluminum layer not to grow and reach the layer underlying the aluminum layer. Examples of an intermetallic compound in solid-phase diffusion with regard to aluminum and gold are $Au_5Al_2$, $Au_4Al$, $Au_2Al$, $AuAl$, and $AuAl_2$. In this embodiment, most of the compound observed is $Au_4Al$. In the reaction of aluminum and gold. Practically, the thickness of this aluminum layer is preferably 15,500 Å or less. If the thickness of the aluminum layer exceeds this value, it tends to cause blurring or the like, thereby degrading printing precision. The variations in thickness of the solid-phase diffusion layer falls within the range of 2,200±300 Å. The thickness of the aluminum layer is required to at least 2,500 Å or more. However, to improve the reliability of the device, the thickness of the aluminum layer is preferably not less than 2,600 Å.

Figure 13:
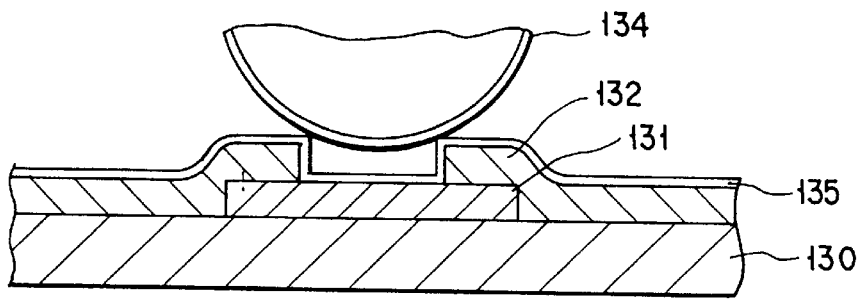
FIG. 13 is a view showing a relationship between the resistor portion of a printing head and a wiring layer.
Figure 14:
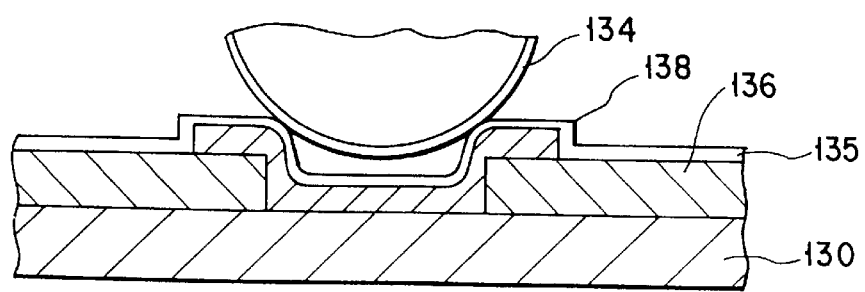
FIG. 14 is a view showing another relationship between the resistor portion of the printing head and a wiring layer.

When the thickness of the aluminum layer is excessively large, the total thickness of the wiring layer tends to increase. FIGS. 13 and 14 show relationships between the wiring layers and the resistor portions of printing heads, respectively. As shown in FIG. 13. when a resistor 131 is formed on a substrate 130 and an aluminum wiring layer 132 is formed on the resistor 131, a distance between a printing medium 134 and the resistor 131 undesirably tends to increase to cause blurring or the like, thereby degrading printing precision. As shown in FIG. 14, when a resistor 138 is formed on an aluminum layer 136, the drawback shown in FIG. 13 and a drawback in which the resistor 138 is disconnected by the aluminum wiring layer 136 are caused. In particular, this typically occurs when the thickness exceeds 16,000 Å. Reference numeral 135 denotes a protective layer. Therefore, the thickness of the entire wiring layer must be preferably, 16,000 Å or less. When a practical application is taken into consideration, the total thickness of the wiring layer is preferably 3,000 Å or more. Otherwise, the printing head tends to have poor reliability.

In the electronic circuit device having the printing head according to the present invention, the thickness of the aluminum layer is set to 2,500 Å or more, and the total thickness of the wiring layer is preferably set to 16,000 Å or less. When a practical application is taken into consideration, the thickness of the aluminum layer is preferably set to 2,500 Å to 15,500 Å, and the total thickness of the wiring layer is preferably set to 3,000 Å to 16,000 Å, thereby providing a printing head almost free from degradation in printing precision.

As described above, the technique according to the first embodiment of the present invention can be applied to a passive chip element, a package incorporating a semiconductor element, a printing head, and the like.

Since bonding can be performed by solid-phase diffusion without melting and connecting a solder, the spread of the solder upon its melting and short-circuiting between adjacent electrodes can be almost prevented. Electronic circuit devices in which the passive chip element and the substrate, the package and the substrate, and the semiconductor element and the substrate are connected through the bumps at a high connection strength can be provided. When an oxide film is formed on a wiring pattern, heating and compression bonding are simultaneously performed to destroy the oxide film, thereby achieving connection having a high allowable current density.

According to the present invention, when a gold bump having a relative low hardness is used as a bump, a passivation film on a bonding pad of a semiconductor element will not crack. Since gold is rarely oxidized, solid-phase diffusion can be facilitated, and highly reliable bonding can be easily performed. In addition, when aluminum as a wiring metal subjected to solid-phase diffusion with gold is used, the connection resistance can be easily reduced to contribute to a reduction in production cost.

In actual mounting, when a semiconductor element is stamped on a heat source substrate, the bumps can have a predetermined height, and a plurality of bumps can be easily connected at once.

When bumps are selectively heated with an infrared ray or the like, only bump portions are heated to a temperature required for bonding, and the bumps can be connected to the substrate before the bump temperature is reduced. In this case, heat conduction is delayed to prevent a semiconductor element failure caused by an increase in temperature. That is, when infrared heating is used, the bump portion can be efficiently heated, while the semiconductor element need not be heated, thereby preventing thermal degradation of the semiconductor element.

When a metal layer having a low heat conductivity is formed as a barrier layer between a semiconductor element and a bump, heat conduction to the semiconductor element can be prevented, and an increase in temperature of the semiconductor element can be prevented.

In addition, when a bump is formed to have a concave recess, an area of the boundary between the solid-phase diffusion layer and the wiring layer can be increased to increase the bonding strength, thereby achieving highly reliable connection.

The second embodiment of the present invention will be described below.

The second embodiment provides a semiconductor device as a more practical example of the first embodiment.

The second embodiment of the present invention is an example of the first embodiment and provides a semiconductor device comprising:

an insulating substrate;

a wiring layer formed on the insulating substrate;

bump-like bonding means bonded to a surface of the wiring layer by solid-phase diffusion; and a semiconductor element formed on the bonding means.

Figure 15:
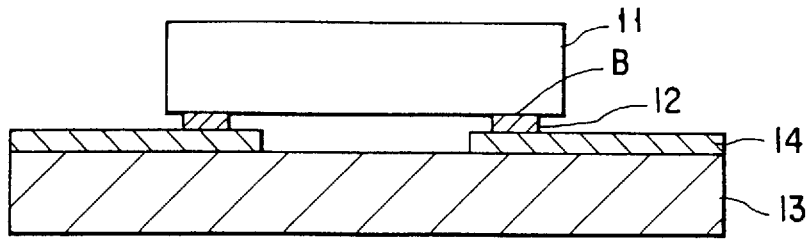
FIG. 15 is a view showing a semiconductor device according to the second embodiment of the present invention.

FIG. 15 is a view showing a semiconductor device according to the second embodiment of the present invention. This semiconductor device is used for a liquid crystal panel. The semiconductor device comprises a semiconductor element 11, gold bumps 12 formed on the surface of the semiconductor element 11 by electroplating or the like, molybdenum/aluminum multi-layered wiring layers 14 bonded to the corresponding gold bumps 12 by solid-phase diffusion, and the multi-layered wiring layers 14 are formed on a wiring substrate 13. The wiring substrate 14 consists of a glass substrate, and each gold bump 12 of the semiconductor element 11 is connected to aluminum of the corresponding wiring layer 14 by solid-phase diffusion. In the semiconductor device shown in FIG. 15, the gold bumps 12 are connected to the aluminum layers of the corresponding wiring layers 14 by solid phase diffusion.

The wiring substrate has thin film transistors, a liquid crystal, polarizing plates, and the like, all of which are formed on the glass substrate.

An example of the manufacturing process of the semiconductor device shown in FIG. 15 will be described below.

Figure 16A:
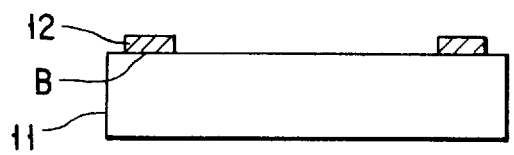
FIGS. 16A to 16C are views showing the steps in manufacturing the semiconductor device according to the second embodiment of the present invention.
Figure 16B:
Figure 16C:
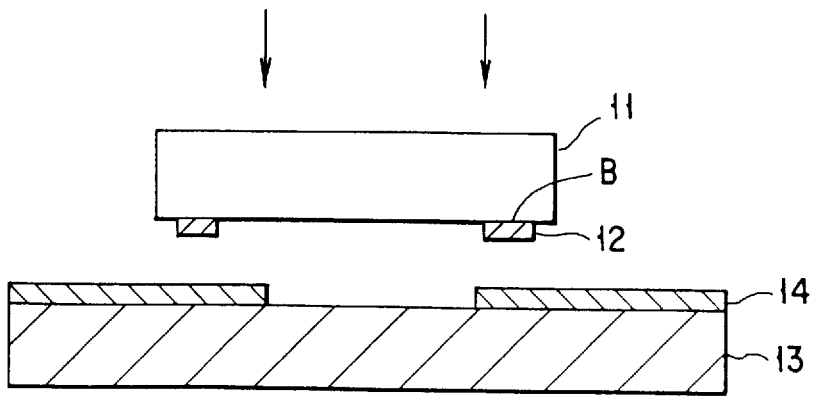

FIGS. 16A to 16C are views for explaining this manufacturing process. This manufacturing process includes the step of connecting, through a bump, a semiconductor element to the wiring pattern formed on the surface of the insulating substrate, wherein the bump and the wiring pattern are heated to temperatures lower than their melting points so as to bond the wiring pattern to the bump by solid-phase diffusion. As shown in FIG. 16A, as a barrier metal B, a titanium layer, a nickel layer, and a palladium layer are formed on the bonding pad of the semiconductor element from the semiconductor element side, and the resultant structure is electroplated to obtain the gold bumps 12. In this case, the titanium layer is formed to increase the adhesion strength with the aluminum pad, the nickel layer is formed to prevent diffusion of gold into the bonding-pad of the semiconductor element, and the palladium layer is formed to increase the bonding strength with gold.

As shown in FIG. 16B, wiring patterns each constituted by a two-layered structure consisting of a lower molybdenum layer and an upper aluminum layer are formed in desired regions on the glass substrate. In this case, 26 input pads and 120 output pads are formed on each glass substrate.

The semiconductor element side is heated to 400° C., the glass substrate side is heated to 80° C., the semiconductor element and the substrate are positioned, as shown in FIG. 16C, and compression bonding is performed with a load of 30 g/bump for 0.2 sec, thereby connecting all the pads at once. The adhesion strength between the semiconductor element and the glass substrate upon bonding was about 4.0 kgf.

In the resultant semiconductor device, each gold bump is brought into tight contact with the corresponding aluminum layer to destroy the oxide film formed on the aluminum layer of the wiring layer 14. In this case, solid-phase diffusion bonding is performed to obtain rigid bonding to increase the allowable current value and reduce the connection resistance.

Since all the connections can be obtained at once, the bonding time can be greatly reduced as compared with one-to-one wire bonding which takes 17.5 sec (0.12 sec for each bonding wire). In addition, the required mounting area for bump connection can be greatly reduced.

Figure 17:
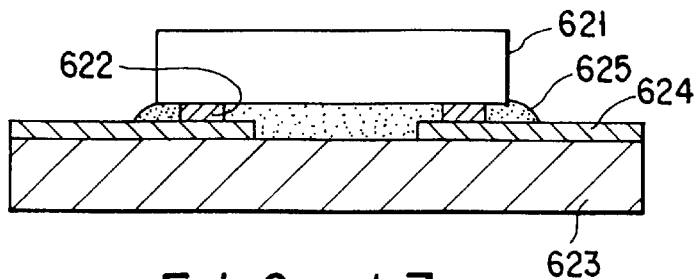
FIG. 17 is a view showing another semiconductor device according to the second embodiment of the present invention.

FIG. 17 is a view showing another example of the semiconductor device according to the second embodiment of the present invention. More specifically, FIG. 17 is a sectional view of the semiconductor device according to the second embodiment of the present invention.

In this example, an alumina substrate 623 is used as a substrate, and resistor patterns (not shown) and wiring patterns 624 such as electrode wiring layers are formed on the alumina substrate by sputtering, and a drive IC chip 621 is connected to the wiring patterns 624 by solid phase diffusion. The drive IC chip 621 is adhered to the alumina substrate 623 with an insulating adhesive 625 to seal, thereby preventing the bump connection from ambient condition such as penetrating of moisture.

That is, in this semiconductor device, the semiconductor element or IC chip 621 is connected to the aluminum wiring layers 624 formed on the alumina wiring substrate 623 through gold bumps 622 formed on the semiconductor element 621 by electroplating or the like. The gold bumps 622 of the semiconductor element 621 are connected to the wiring layers 624 by solid-phase diffusion. That is, the gold bumps 622 are connected to the aluminum wiring layers 624 by solid-phase diffusion.

A manufacturing process of this semiconductor device will be described below.

As barrier metals B, a titanium layer, a nickel layer, and a palladium layer are formed on the bonding pads of the semiconductor element, and the gold bumps 622 are formed on the bonding pads through these layers. The gold bumps 622 have variations of ±1.5 µm in height. The gold bumps 622 are stamped on a heat source substrate to set the height of the bumps constant.

After the resistor patterns are formed on the alumina substrate 623 by sputtering, wiring patterns 624 each constituted by a two-layered structure of W and Al are formed as electrode patterns from the substrate side. All the pads are brought into tight contact with the electrode patterns at once, and the alumina substrate 623 are heated to bond the bumps to the electrode patterns by solid-phase diffusion. The resultant semiconductor device has the effect of the above semiconductor device and an effect of preventing heat conduction from the alumina substrate 623 to the semiconductor element 621 because titanium has a lower heat conductivity than that of gold. As a result, an increase in temperature of the semiconductor element 621 can be prevented.

The semiconductor element 621 is compressed by the above stamping to align the heights of the bumps, thereby achieving accurate, more reliable connection. In addition, when the gold bumps 622 are selectively heated with an infrared ray or the like in place of heating the alumina substrate 623, only the gold bumps 622 can be heated to suppress the influence of heat to the semiconductor element 621.

Still another example of the second embodiment according to the present invention will be described below.

Figure 18A:
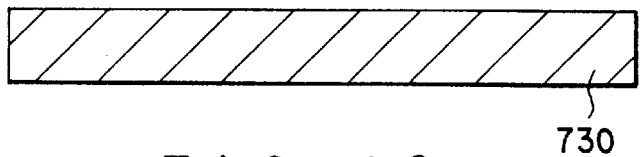
FIGS. 18A and 18B are views for explaining the steps in manufacturing a wiring substrate used in still another example of the second embodiment of the present invention.
Figure 18B:
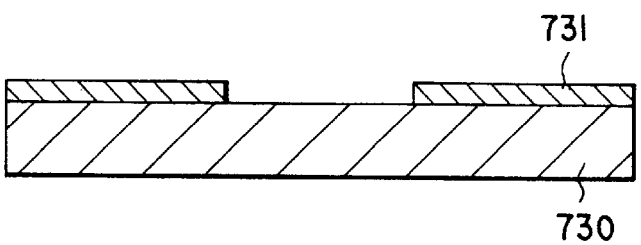

FIGS. 18A and 18B are views for explaining a manufacturing process of a wiring substrate used in this example of the second embodiment of the present invention. The wiring substrate is formed as follows. An aluminum thin film is formed on a ceramic substrate 730 shown in FIG. 18A by sputtering. The aluminum thin film is patterned by photolithography to obtain wiring patterns 731 consisting of aluminum shown in FIG. 18B.

Figure 19A:
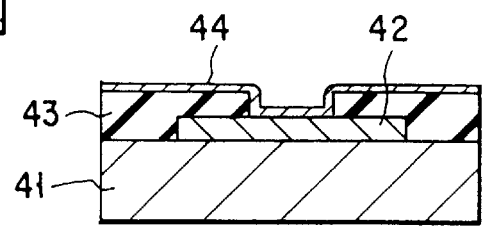
FIGS. 19A to 19C are views for explaining the process of forming a bump.
Figure 19B:
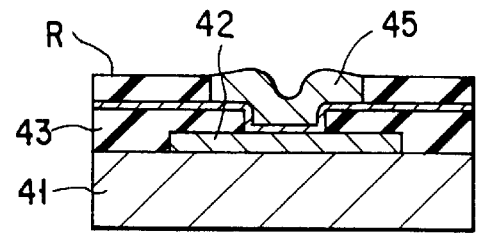
Figure 19C:
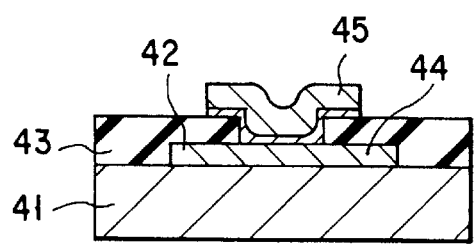

FIGS. 19A to 19C are views for explaining a process of forming bumps. As shown in FIG. 19A, a silicon substrate having a desired element formation area is prepared as a semiconductor element 41, and a silicon nitride film 43 serving as a passivation film is formed on an aluminum wiring pattern 42 formed on the surface of this silicon substrate. A contact hole is formed in the silicon nitride film by photo-lithography. A barrier metal layer 44 consisting of titanium, nickel, and palladium is formed by vacuum deposition.

As shown in FIG. 19B, a resist R is applied to the barrier metal layer 44 and patterned. The resultant structure is dipped in a plating solution to electroplate the barrier metal layer 44 as an electrode, thereby selectively forming a gold bump 45 on the barrier metal layer 44 exposed from the resist R.

Finally, as shown in FIG. 19C, the resist R is removed, and the barrier metal layer 44 is partially etched using the bump 45 as a mask to obtain the hump 45 whose central portion is recessed in a concave shape.

In actual mounting, the resultant semiconductor element 41 is located above the wiring pattern 731 on the ceramic substrate 730 shown in FIG. 18B and is heated to about 400° C. to bond the bump 45 to the wiring pattern 31.

Figure 20:
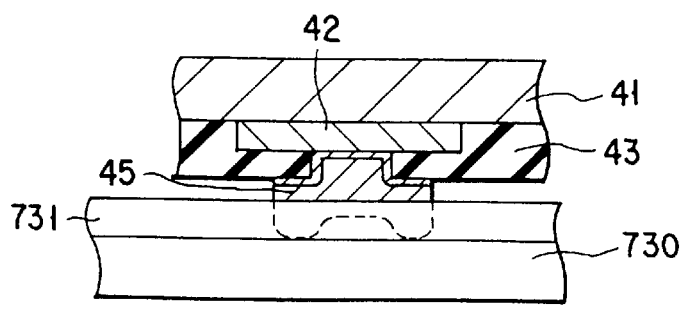
FIG. 20 is a view showing a state in which the bump of the second embodiment of the present invention is bonded to a wiring pattern.

FIG. 20 shows a view showing a state in which the bump according to the second embodiment of the present invention is bonded to the wiring pattern. At this time, since the central portion of the bump 45 has the recess in the concave shape, a solid-phase diffusion layer is formed, as indicated by a dotted line in FIG. 20. The area of the boundary between the solid-phase diffusion layer and the aluminum wiring layer 731 is increased to obtain a high bonding strength.

In the resultant semiconductor device, even if an oxide film is formed on the aluminum wiring layer 731 on the ceramic substrate 730, the oxide film can be properly destroyed by compression bonding, and good bonding can be assured by solid phase diffusion. Therefore, the allowable current value can increase and the connection resistance can be reduced.

According to the present invention, even if a wiring layer such as an aluminum wiring layer has a rigid oxide film and a wiring substrate consists of a material having poor wettability with the solder, the semiconductor element or the like can be properly bonded to the semiconductor substrate by solid-phase diffusion bonding. At the same time, highly reliable connection with a high mechanical strength can be achieved.

As described above, the semiconductor device according to the present invention uses a glass substrate for a flat display such as a liquid crystal display device or a ceramic substrate for a printing head.

The third embodiment of the present invention will be described below.

According to the third embodiment of the present invention, there is provided a liquid crystal display device comprising a pair of substrates, a liquid crystal sandwiched between the pair of substrates, a wiring layer formed on one of the pair of substrates and including a top layer containing aluminum as a main component, and a semiconductor element formed on the wiring layer through a bump wherein the bump and the aluminum layer are bonded to each other by solid-phase diffusion, the aluminum layer has a thickness of 2,500 Å to 8,000 Å or more, and the wiring layer has a thickness of 3,000 Å to 8,500 Å or less.

In this liquid crystal display device, the wiring pattern has a layer containing at least aluminum as a main component, as an uppermost or top layer. Layers of other materials such as molybdenum, chromium, and a molybdenum-tungsten alloy may be formed as underlying layers of the aluminum layer, thereby obtaining a multi-layered wiring pattern. In this case, the thickness of the wiring layer means the thickness of the multilayered wiring layer.

The following points are preferably taken into consideration when the technique of the present invention is applied to a liquid crystal display device.

When the thickness of the aluminum layer as the uppermost layer of the wiring pattern formed on the glass substrate, an intermetallic compound serving as a solid-phase diffusion layer of a bump consisting of aluminum and gold is produced in a layer (e.g., an Mo layer) underlying the aluminum layer to greatly decrease the bonding strength between the solid-phase diffusion layer and the underlying molybdenum layer, thereby maybe causing cracking and peeling.

When the thickness of the aluminum layer increases, the total thickness of the wiring pattern increases. In rubbing (aligning) a liquid crystal portion, uniform alignment cannot be performed due to the large thickness of the wiring pattern. As a result, the display screen tends to become irregular.

In consideration of the above problem, the present inventors optimized the thickness of an aluminum wiring layer when a semiconductor element was mounted on an LCD substrate utilizing metal solid-phase diffusion on the basis of the technique of the present invention. The present inventors examined the relationship between the growth of the inter-metallic compound of aluminum and gold and the thickness of the aluminum wiring layer. As a result, when the thickness of the aluminum layer is smaller than 2,200 Å in heating at 400° C. for 0.2 sec, the solid-phase diffusion layer consisting of the inter-metallic compound of aluminum and gold is produced in the lowermost layer of the wiring layer, and cracking and peeling tend to occur. As a result of an experiment, the solid-phase diffusion layer of aluminum and gold was diffused to a depth corresponding to the thickness of 2,200 Å from the boundary between the gold bump and the aluminum layer. It was found that the thickness of the solid-phase diffusion layer varied in the range of 1,900 Å to 2,500 Å due to factors such as variations in heights of gold bumps and the inclination of the semiconductor element. Therefore, the thickness of the aluminum layer was found to be at least 2,500 Å so as to cause diffusion of the solid-phase diffusion layer not to reach the underlying layers consisting of molybdenum, chromium, and a molybdenum-tungsten alloy. The variations in thickness of the solid-phase diffusion layer falls within the range of 2,200±300 Å. The thickness of the aluminum layer is required to at least 2,500 Å or more. However, to improve the reliability of the device, the thickness of the aluminum layer is preferably 2,600 Å or more. In practice, when the thickness of this aluminum layer is preferably 8,000 Å or less. If the thickness exceeds this value, it tends to occur reverse of liquid crystal alignment because uniform rubbing treatment cannot be performed.

When the thickness of the aluminum layer is excessively large, the total thickness of the wiring pattern tends to increase. Irregularities tend to occur in rubbing (aligning) the liquid crystal portion. An irregularity ratio is represented by a reverse area ratio i.e., (area subjected to reverse discrimination on one screen/area of one screen), and the relationship between this and the wiring thickness is shown in FIG. 22. As can be apparent from FIG. 22, when the wiring thickness is 8,500 Å or less, no irregularities occurred in rubbing the liquid crystal portion. However, when the wiring thickness exceeds 8,500 Å, the reverse area is found to increase. When a practical application is taken into consideration, the total wiring thickness is preferably 3,000 Å or more. Otherwise, reliability tends to decrease due to growth of a diffusion layer.

In consideration of the above findings, there can be provided a highly reliable liquid crystal display device free from rubbing irregularities when the thickness of the aluminum layer is set to 2,500 Å or more and the total wiring thickness is set to 8,500 Å or less.

FIG. 21 is a schematic view showing an example of the liquid crystal display device according to the third embodiment of the present invention.

As shown in FIG. 21, a semiconductor element 84 is connected through gold bumps 83 to molybdenum/aluminum wiring layers 82 formed on a glass substrate 81. In this case, gold of each gold bump 83 is directly bonded to aluminum of the corresponding molybdenum/aluminum wiring layer 82 by solid-phase diffusion. In this liquid crystal display device, the thickness of the aluminum layer was 5,000 Å, and the thickness of the molybdenum layer was 500 Å. The gold bumps 83 were formed by electro plating. The size of each bump was 50 μm, the bump pitch was 80 μm, and the bump height was 20 μm.

An TFT-LCD substrate was used as the glass substrate 81. Although not shown, a portion elongated below the glass substrate 81 constitutes a TFT-LCD. Wiring patterns 82 each constituted by a structure obtained by stacking molybdenum and aluminum from the upper surface side are formed on the substrate 81. The molybdenum/aluminum wiring layers 82 are formed on the substrate 81 by sputtering. That is, a 5,000-Å thick aluminum layer is formed on a 500-Å thick molybdenum layer. The gold bumps 83 and aluminum are subjected to solid-phase diffusion at 300° to 500° C. to form a gold-aluminum alloy.

In this liquid crystal display device, the semiconductor element 84 having 26 input bumps and 120 output bumps was used, the semiconductor element 84 was heated to 400° C., the glass substrate 81 was heated to 80° C., and compression bonding was performed with a load of 30 g/bump to cause a solid-phase diffusion reaction between gold and aluminum, thereby bonding the gold bumps 83 to the wiring layers 82.

After bonding, the adhesion strength between the semiconductor element 84 and the glass substrate 81 was 4.0 kgf, thus maintaining a sufficient high strength. The contact resistance was 20 to 30 mΩ/bump. A high-temperature, high-humidity test (70° C., 90% R.H., 1,000 hours) and a thermal shock test (−40° C./100° C., 30 min/30 min, 1,000 cycles) of the resultant sample were conducted. Variations in contact resistance fell within the range of ±10%, thus achieving extremely stable electrical connection.

The adhesion strength between the semiconductor element 84 and the glass substrate 81 was evaluated by a die share under the same environmental conditions as described above. The variations in adhesion strength fell within the range of about 10% with respect to the initial strength of 4.0 kgf, thus obtaining a satisfactory level in practical use. No defects were found in rubbing the liquid crystal portion.

Another example of the liquid crystal display device according to the third embodiment of the present invention will be described below.

In this example, a sample as in the liquid crystal display device shown in FIG. 21 was obtained except that the total thickness of each wiring pattern 82 was 8,500 Å in such a manner that the thickness of an aluminum layer of each wiring layer 82 was 8,000 Å and the thickness of a molybdenum layer was 500 Å.

The same tests as described above were conducted for this sample. The adhesion strength between a semiconductor element 84 and a glass substrate 81 upon bonding was 4.0 kgf, thus maintaining a sufficiently high strength. The contact resistance was 20 to 30 mΩ per a bump. The same reliability test as described above was conducted for this sample, and variations in contact resistance fell within the range of ±7%, thus achieving extremely stable electrical connection. When the adhesion strength between the semiconductor element and the glass substrate was evaluated by a die share under the same environmental conditions described above, the variations in adhesion strength fell within the range of about 10% with respect to the initial strength of 4.0 kgf, thus obtaining a satisfactory level in practical use. As can be apparent from FIG. 22, no defects occurred in rubbing a liquid crystal portion.

A comparison test was performed for one example and still another example of the liquid crystal display device shown in FIG. 21.

COMPARATIVE EXAMPLE 3

A sample as in the fourth embodiment except that the thickness of an aluminum layer was 2,000 Å was prepared. The same tests as in the liquid crystal display device shown in FIG. 21 were conducted for this sample. The adhesion strength between a semiconductor element and a glass substrate was 0.9 kgf, and the semiconductor element peeled off from the glass substrate soon. This is because an intermetallic compound of aluminum and gold reached the molybdenum interface below the aluminum wiring layer.

COMPARATIVE EXAMPLE 4

A sample was prepared as in the liquid crystal display device shown in FIG. 21 except that each wiring layer 83 having a thickness of 10,500 Å was formed such that the thickness of an aluminum layer was 10,000 Å and the thickness of a molybdenum layer was 500 Å. The same tests as described above were conducted for this sample. The adhesion strength and contact resistance between a semiconductor element 84 and a glass substrate 81 and variations in contact resistance have satisfactory levels in practical use. However, as shown in FIG. 22, it was found that the liquid crystal display device was degraded because the defects were formed by a maximum of 10% in rubbing a liquid crystal portion.

A temperature at which a bump reacts with a wiring layer is preferably low to prevent damage to the semiconductor device. In particular, when a liquid crystal device using a liquid crystal having a low heat-resistant temperature and polarizing plates having a low heat-resistant temperature is assumed in COG (Chip On Glass) mounting, a liquid crystal panel having thin film transistors, a liquid crystal, and polarizing plates is often used as the glass substrate. For this reason, the liquid crystal panel has temperature limitations. Although the liquid crystal panel can be locally heated to several hundreds of °C., a temperature applied to a pixel portion is preferably 100° C. or less and apart from a semiconductor element more than 2 mn in consideration for simulation and the result of the test. ITO is generally used as a wire material of the liquid crystal panel. The wiring resistance is preferably low. For this reason, ITO is used in combination with a metal wiring material. Of these combinations, use of aluminum having a low resistance and high stability as a COG mounting wiring material is advantageous in view of performance, reliability, and cost. The present invention is also effective in mounting such as COB (Chip On Board) mounting in addition to COG mounting.

In the liquid crystal display device according to the third embodiment of the present invention, the bumps are connected to the wiring patterns formed on the mounting insulating substrate by solid-phase diffusion. For this reason, an extremely high connection strength can be obtained. In addition, even if an oxide film is formed on a wiring pattern, compression bonding is performed together with heating, thereby destroying the oxide film and hence achieving connection having a high allowable current density.

As described above, according to the present invention, there is provided a semiconductor device having micro pitch connections wherein connection with a wiring substrate having a wiring pattern consisting of a material having poor wettability with the solder due to the presence of a rigid oxide film such as an aluminum oxide film on an aluminum wiring layer can be properly and highly reliably performed by solid-phase diffusion bonding. There is also provided a high-quality liquid crystal display device wherein the thickness of a wiring pattern applied to a liquid crystal display device is set to 2,500 Å or more and 8,500 Å or less to obtain a sufficiently high adhesion strength and a sufficiently low contact resistance.

The fourth embodiment of the present invention will be described below.

According to the fourth embodiment of the present invention, there is also provided a circuit substrate comprising a substrate, and a multilayered wiring layer constituted by a first metal layer formed on the substrate, an oxide film formed on the first metal layer and consisting of the same metal as that of the first metal layer, and a second metal layer formed on the metal oxide film and consisting of a metal as in the first metal layer.

This multilayered wiring layer can be used in a variety of applications as the wiring layers used in the first to third embodiments.

The fourth embodiment of the present invention will be described with reference to the accompanying drawings. This embodiment will exemplify flip-chip mounting using solid-phase diffusion bonding.

FIG. 23 is a view showing a state in which a semiconductor element is mounted on a circuit board according to an example of the fourth embodiment of the present invention. Referring to FIG. 23, an insulating substrate 1 comprises a glass substrate, a ceramic substrate, or a metal core substrate. FIG. 24 is a plan view of FIG. 23. Each multilayered pattern or layer 5 obtained by sequentially stacking a first metal layer 2, an oxide layer 3, and a second metal layer 4 is selectively formed, as shown in FIG. 24. Each bump 7 of the semiconductor element 6 is bonded to the corresponding multilayered pattern 5 by solid-phase diffusion. For this reason, the materials of the first and second metal layers (wiring layers) and the bumps 7 are determined under the conditions that the bumps are reacted with the wiring layers by solid-phase diffusion to obtain mechanical and electrical connections, and that the first and second metal layers produce an oxide. More specifically, each bump 7 is made of copper, gold, aluminum, tin, or an alloy containing such a metal material. The wiring layers, i.e., the first and second metal layers 2 and 4 are made of a metal (e.g., aluminum, copper, or tin) or an alloy containing such a metal. The bump and the metal layers are subjected to solid phase diffusion at temperatures lower than their melting points to bond the bumps to the metal layers.

In this circuit substrate, the bumps 7 are made of gold, and the metal layers 2 and 4 serving as the wiring layers are made of aluminum. In this case, when each gold bump 7 is brought into tight contact with the corresponding aluminum wiring layer, i.e., the corresponding multilayered pattern 5, an oxide film (not shown) on the second metal layer 4 is destroyed, so that gold of the bump directly reacts with aluminum of the multilayered film.

To form the bumps 7, a method such as deposition, plating, or transfer is used. The bumps are formed in this circuit substrate by plating. A lot of known examples are proposed as methods of forming bumps by plating, and a detailed description thereof will be omitted. The wiring multilayered pattern 5 is formed as follows. More specifically, molybdenum is formed by sputtering to a thickness of 500 Å on a non-alkali glass having a thickness of 1.1 mm and a diameter of 5 inches. The aluminum layer 2 is then formed on the molybdenum layer to a thickness of 3,000 Å. At this time, the conditions are given such that the vacuum degree is 6×10 E-4Pa, the substrate temperature is 150° C., and the argon pressure is 7×10 E-1Pa. After the aluminum layer 2 is formed, the vacuum state of the process chamber is returned to the atmospheric state. Alumina 3 as an aluminum oxide is formed on the aluminum layer 2 to a thickness of 5 to 100 Å, and preferably about 45 Å.

Thereafter, the process chamber is then set in a vacuum state again, and the aluminum layer 4 is formed on the alumina 3 to a thickness of 3,000 Å. After this film formation, the resultant structure is patterned to form wiring patterns. Patterning is performed by general methods such as resist coating, exposure, and etching.

Bonding of the semiconductor element 6 on the above wiring patterns 5 on the circuit substrate will be described below.

The semiconductor element 6 having input and output bumps is heated to 380° C., and the glass substrate 3 is heated to 80° C. In this state, the bumps of the semiconductor element are brought into tight contact with the circuit substrate with a load of 20 g for 0.8 sec to bond the gold bumps 7 to the wiring patterns 5 by solid-state diffusion. At this time, the gold bumps are bonded to the second metal layers 4 of the wiring patterns 5, respectively. A strength required to forcibly peeling the semiconductor element 6 from the circuit substrate upon bonding is 1.8 kg, thus obtaining sufficiently high strength in practical use. In this peeling operation, the second metal layer 4 is peeled from the insulating film 3 or the insulating film 3 is peeled from the first metal layer 2. After pealing, the circuit substrate is cleaned, another semiconductor element is bonded to this circuit substrate under the same conditions as described above, thereby bonding gold bumps to the aluminum wiring pattern 5 by solid-phase diffusion. At this time, since the second metal layer 4 is not present in a peeled portion, so that the metal bumps 7 of the new semiconductor element are bonded to the first metal layers 2 by solid-phase diffusion bonding, respectively. After this re-bonding, the operation of the semiconductor element was examined, and it was confirmed that the semiconductor element was normally operated.

In the above example, the wiring pattern 5 has a three-layered structure consisting of the first metal layer 2, the oxide layer 3, and the second metal layer 4. The number of layers constituting the wiring pattern may be four or more. For example, another example of the fourth embodiment of the present invention is shown in FIG. 25. As shown in FIG. 25, each multilayered pattern or layer 5 is formed by alternately forming metal layers 2, 4, 9, and 11, and oxide layers 3, 8, and 10. Since the wiring pattern 5 has a multilayered structure, peeling can be performed between different layers. This circuit substrate can be repaired a plurality of times. In particular, in this circuit substrate, the oxide layers 3, 8, and 10 are formed such that their thicknesses are gradually increased within the range of, e.g., 5 to 100 Å. That is, the lowermost oxide layer 3 has the smallest thickness, and the intermediate oxide layer 8 and the uppermost oxide layer 10 sequentially have larger thicknesses. In peeling, the layers are peeled from the uppermost layer, so that the circuit substrate can be repaired at least twice. The thicknesses of the oxide layers can be sequentially increased by, e.g., gradually increasing the oxidation times in a non-vacuum atmosphere.

In peeling the semiconductor element bonded to the first metal layer, the oxide layer, and the second metal layer on the circuit substrate in accordance with solid-phase diffusion, the semiconductor element is peeled from the substrate at the boundary between the oxide layer and one of the first and second metal layers because this boundary has the lowest adhesion strength. After peeling, bumps on another semiconductor element can be bonded to the metal layers by solid-phase diffusion.

According to the present invention, therefore, a repairing operation for assuring highly reliable connection can be easily realized.

The fifth embodiment of the present invention will be described below.

According to the fifth embodiment of the present invention, there is provided a circuit substrate comprising a substrate, a wiring layer formed on the substrate, and first and second pad arrays formed on the wiring layer, wherein the first and second pad arrays are defined such that a central coordinate position of the second pad array is defined as $(x_i+j, y_i+k)$ ($i=1$ to $n$; $j$ and $k$ are moving distances) when a central coordinate position of the first pad array is defined as $(x_i, y_i)$ ($i=1$ to $n$).

This wiring pattern can be used in a variety of applications as the wiring layers of the first to third embodiments.

FIGS. 26A to 26E are schematic views showing an example of the fifth embodiment of the present invention.

Figure 26A:
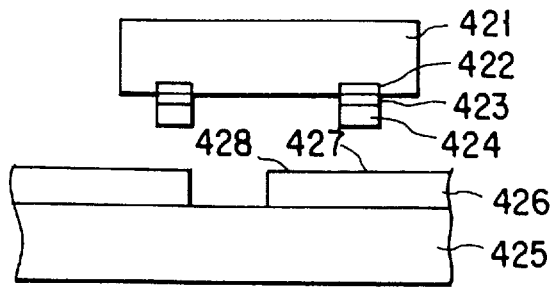
FIGS. 26A to 26E are schematic views showing an example of the fifth embodiment of the present invention.

FIGS. 26A to 26E show the principle of this embodiment, i.e., the repairing process of a semiconductor device. More specifically, as shown in FIG. 26A, bonding pads 422 are formed on a semiconductor element 421, and barrier layers 423 formed of titanium, nickel, and palladium are stacked on the bonding pads 422, respectively. Gold bumps 424 are formed on the barrier layers 423, respectively. The semiconductor element 421 is mounted on a circuit substrate. This circuit substrate comprises an insulating substrate 425, wiring patterns 426 made of aluminum, copper, or the like, a first bonding pad array 427, and a second bonding pad array 428. The wiring patterns 426, the first bonding pad array 427, and the second bonding pad array 428 are formed on the insulating substrate 425. As shown in FIGS. 26A to 26E, for illustrative convenience, only the pair of bumps 424 and the wiring pattern 426 are illustrated. However, in practice, a large number of bumps 424 and wiring patterns 426 are formed on the substrate 425 in correspondence with the bonding pads 424 of the semiconductor element 421.

Figure 26B:
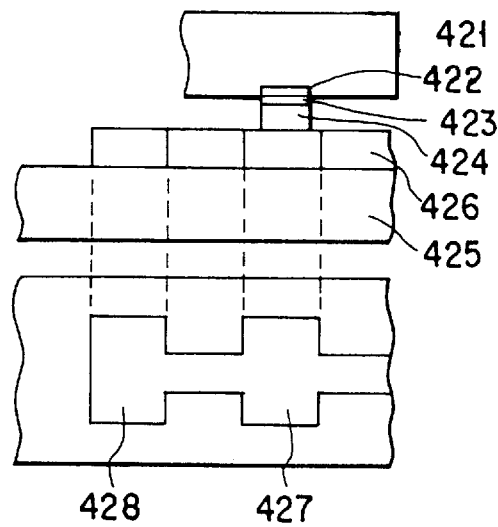
Figure 26C:
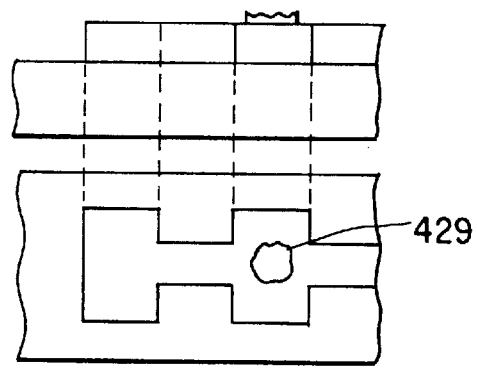
Figure 26D:
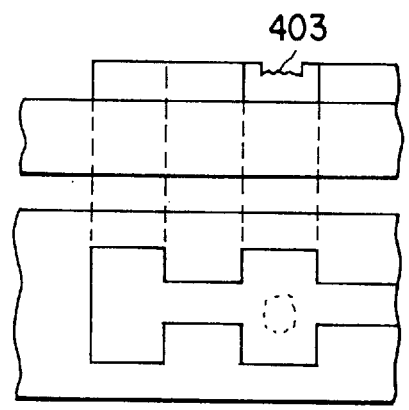

FIG. 26B is an enlarged view of a bonded portion. Referring to FIG. 26B, the bumps 424 are bonded to the first pad array 427 of the circuit substrate by solid-phase diffusion, thereby constituting a semiconductor device. To repair this semiconductor device, the semiconductor element 421 is removed from the substrate 425. In this case, as shown in FIG. 26C, a crack 429 is formed near the bonding boundary between each barrier layer 423 and the corresponding bump 424. In another destruction mode, as shown in FIG. 26D, a crack 403 is formed near the bonding boundary between each bump 424 and the first pad array 427. For this reason, it is difficult to bond a semiconductor element on the first pad array 427 to obtain electrical and mechanical bonding.

Figure 26E:
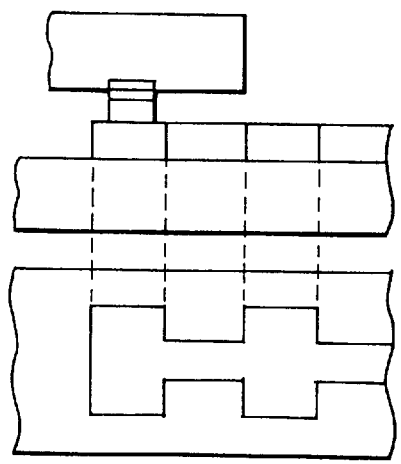

Another semiconductor element 421 is bonded by solid-phase diffusion to the second pad array 428 adjacent to the first pad array 427 from which the semiconductor element was removed, thereby completing repairing the semiconductor device, as shown in FIG. 26E. Solid-phase diffusion bonding can be performed in air or an inert gas atmosphere of $N_2$ gas or the like by a heating method using a heater or a local heating method using a laser beam.

Figure 27A:
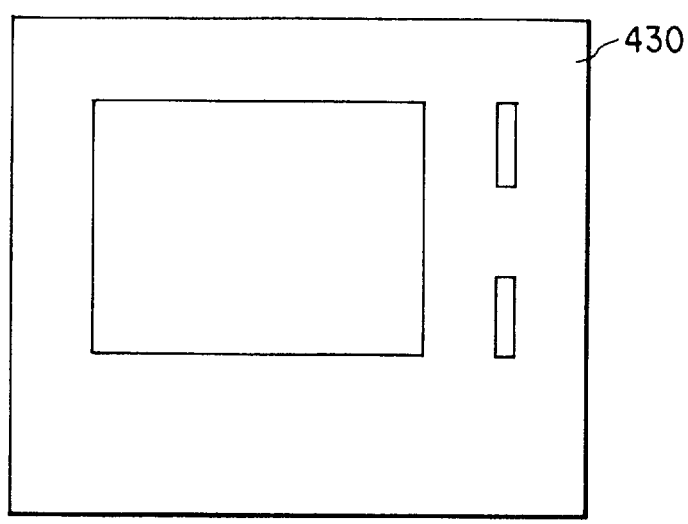
FIGS. 27A and 27B are views for explaining an example of the fifth embodiment of the present invention.
Figure 27B:
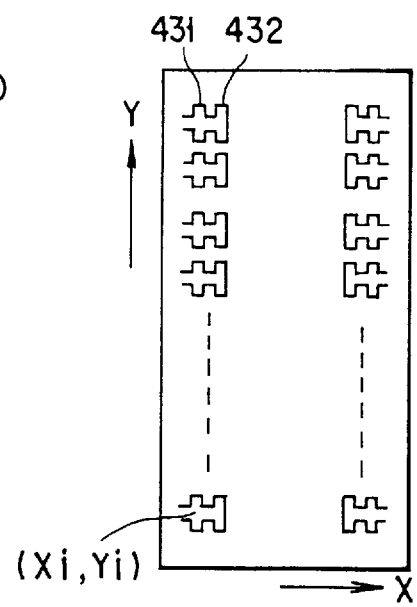

FIGS. 27A and 27B are views for explaining an example of the fifth embodiment of the present invention and show a circuit substrate used for a liquid crystal panel. In this circuit substrate, as shown in FIG. 27A, two-layered wiring patterns each consisting of molybdenum and aluminum are formed in desired regions on a glass substrate 430, as shown in FIG. 27A. First pad arrays 431 are formed in each wiring pattern at only two opposite sides, as shown in FIG. 27B. Second pad arrays 432 are formed at positions translated from the first pad arrays 431 in the X direction. The first pad array has 26 input pads and 120 output pads per chip of the semiconductor device. The second pad array has 26 input pads and 120 output pads. Thin film transistors, a liquid crystal, polarizing plates, and the like are to be formed on the glass substrate in this wiring substrate.

In the above circuit substrate, the semiconductor chip side is heated to 370° C., the glass substrate side is heated to 80° C., and compression bonding is performed with a load of 15 g/hump for 1.5 sec to connect all the pads at once. The adhesion strength between the semiconductor chip and the glass substrate upon bonding is about 2.0 kg, and no defective connections are formed.

After the above bonding, the semiconductor chip is peeled from the substrate, and the first pad array is cleaned with acetone and a diamond paste. Another semiconductor chip is connected to the second pad array 432 under the same conditions as described above. The adhesion strength upon connection did not change and was kept to be about 2.0 kg. No defective electrical connections were formed.

As described above, repairing can be performed. When the semiconductor chip itself becomes defective, another semiconductor chip can be connected to the second pad array to allow re-mounting. The bonding position is simply translated in the X direction, thereby obtaining connections with excellent reproducibility.

In the above circuit substrate, each bump is made of gold, and each wiring pattern is made of molybdenum and aluminum. However, a combination of such materials is not limited to this. Any combination can be used if materials are subjected to solid-phase diffusion. In addition, homogeneous materials such as a gold bump and a gold wiring layer can be bonded to each other. A plurality of re-mounting bonding pads may be formed.

Another example of the fifth embodiment according to the present invention will be described with reference to FIGS. 28A and 28B.

Figure 28A:
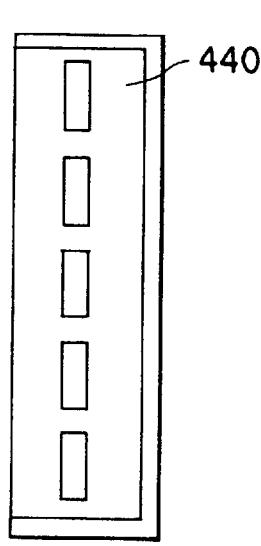
FIGS. 28A and 28B are views for explaining another example of the fifth embodiment of the present invention.
Figure 28B:
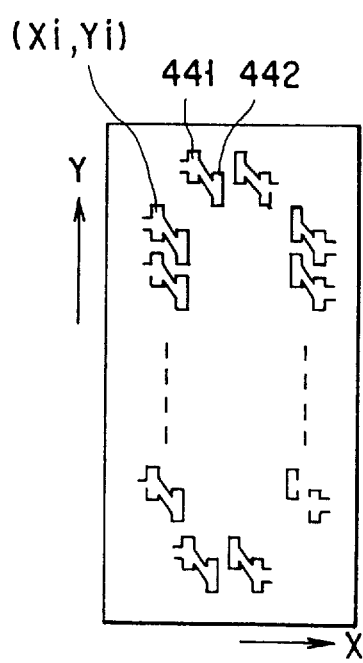

As shown in FIG. 28A, when a wiring substrate is to be applied to a thermal printer head (TPH), an aluminum thin film is formed on a ceramic substrate 440 by sputtering and patterned by photolithography, thereby obtaining the wiring substrate. The wiring pattern has first pad arrays 41 formed at four sides of the wiring pattern, as shown in FIG. 28B. Second pad arrays 442 are formed at positions obtained by translating the pad arrays 441 in both the X and Y directions. The first pad array has 17 input pads and 140 output pads per chip of the semiconductor element. The second pad array has 17 input pads and 140 output pads per chip.

In the above circuit substrate, the semiconductor chip side is heated to 370° C., the glass substrate side is heated to 60° C., and the semiconductor chip is brought into tight contact with the circuit substrate with a load of 10 g/bump for 2 sec, thereby connecting all the pads at once. The adhesion strength between the semiconductor chip and the glass substrate upon bonding was about 2.0 kg, and no defective electrical connections were formed.

After the above bonding, the semiconductor chip is peeled from the substrate, and the first pad array is cleaned with acetone and a diamond paste. Another semiconductor chip is connected to the second pad array 432 under the same conditions as described above. The adhesion strength upon connection did not change and was kept to be about 2.0 kg. No defective connections were formed.

As described above, repairing can be performed. When the semiconductor chip itself becomes defective, another semiconductor chip can be connected to the second pad array to allow re-mounting. The bonding position is simply translated in the X and Y directions, thereby obtaining connections with excellent reproducibility.

The wiring layer is formed by alternately stacking a plurality of metal layers and a plurality of oxide layers. Peeling occurs between the respective layers. For this reason, the circuit substrate can be repaired twice or more.

Re-mounting bonding pads may be formed on a wiring pattern at predetermined positions, so that a new semiconductor element can be bonded to the re-mounting pads. The present invention can facilitate the repairing operations and realize highly reliable connection.

The sixth embodiment of the present invention will be described below.

According to the sixth embodiment of the present invention, there is provided a micro electronic circuit device comprising:

an insulating substrate;

a wiring layer formed on the insulating substrate and containing aluminum;

a bump-like bonding means bonded to a surface of the wiring layer by forming a solid solution and/or an amorphous alloy by solid-phase diffusion and essentially consisting of at least one metal selected from the group consisting of gold, silver, copper, platinum, palladium, nickel, iridium, rhodium, and aluminum; and a micro electronic element formed on the bonding means.

In the present invention, attention is paid to a reaction between aluminum and a metal.

As an index of designing an alloy, the Hume-Rothery's rule is known. According to this rule, if two or more types of metals form a solid solution, the metals have identical crystal structures, and a difference between the atomic radii of the metals is 15% or less. The atomic radius of aluminum is 1.43, and so an atomic radius M of a metal forming a solid solution with aluminum is $$1.22 < M < 1.64$$

Under this condition, examples of a metal having a face-centered cubic lattice, which is the crystal structure of aluminum, are gold, silver, copper, platinum, palladium, nickel, iridium, and rhodium. Bumps using the above metal materials are connected to an aluminum wiring layer by solid-phase diffusion to form a solid solution. With this operation, a stable connection structure can be obtained.

A solid-phase reaction between aluminum and gold will now be exemplified. Aluminum and gold may form an intermetallic compound or an amorphous alloy as a reaction product when heat or a pressure is low, or a bonding time is short. They may form a solid solution as a reaction product when gold is excessively present compared to aluminum, heat or a pressure is high, and the bonding time is long. This is because a solid solution is thermodynamically stable. An intermetallic compound, an amorphous alloy and solid solution almost may be formed around an interface between gold and aluminum performed solid phase reaction because bonding between different metals may be not uniform at the whole bonding area and bonding reaction may be complex. When an intermetallic compound is formed, it can be identified by X ray diffraction method. And when a solid solution is formed, it can be identified by Auger Electron Spectroscopy (AES) analysis.

The sixth embodiment of the present invention will be further described with reference to the accompanying drawings.

Figure 29:
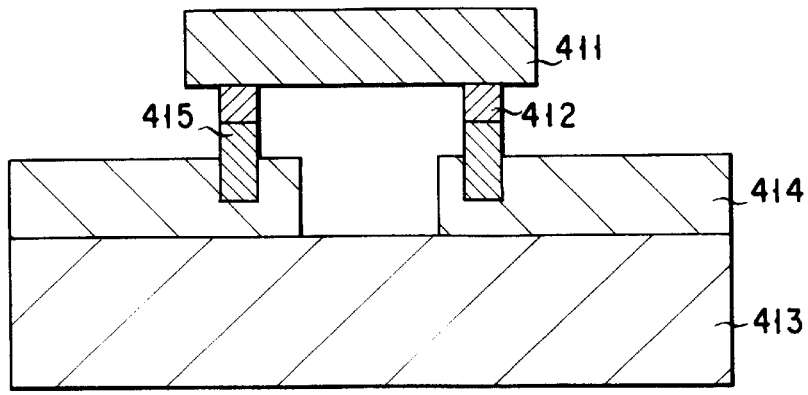
FIG. 29 is a sectional view showing part of a semiconductor device according to the sixth embodiment of the present invention.

FIG. 29 is a sectional view showing part of a semiconductor device according to the sixth embodiment of the present invention. A semiconductor element 411 is connected to aluminum wiring layers 414 on a glass substrate 413 through gold bumps 412. Referring to FIG. 29, each gold bump 412 formed on the semiconductor element 411 is directly bonded to the corresponding aluminum wiring layer 414 by forming an alloy 415 by solid-phase diffusion between the bump 412 and the wiring layer 414. The gold bumps 412 were formed by plating. The size of each bump was 50 $\mu$m×50 $\mu$m, the bump pitch was 80 $\mu$m, and the bump height was 20 $\mu$m. Each wiring layer 414 has a molybdenum/aluminum multilayered structure. The molybdenum/aluminum wiring layers 414 were formed on the substrate by sputtering. That is, a 3,500-Å thick aluminum layer was formed on a 500-Å thick molybdenum layer. The semiconductor element side was heated to 300° C., the glass substrate was heated to 60° C., and thermocompression bonding was performed with a load of 70 g/bump for 10 sec to connect all the pads at once. No defective electrical connection was formed.

Figure 31:
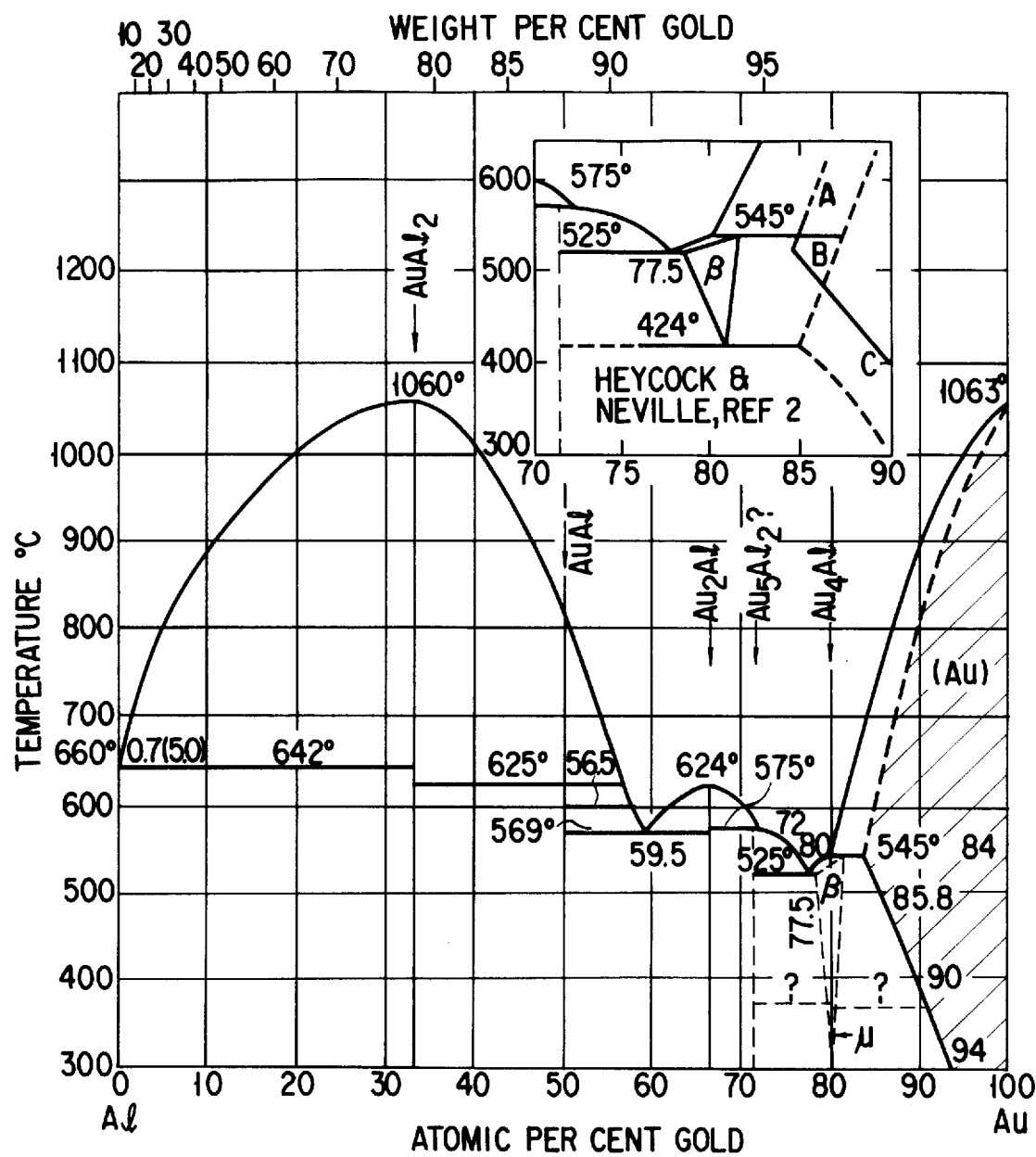
FIG. 31 is a graph showing the state of a gold/aluminum binary system.

The obtained semiconductor device was subjected to a thermal shock test as a reliability test at –40° C./120° C. for 30 min in 1,000 cycles. As a result, stably electrical connection was achieved. A sectional surface of connection between the gold bump and the corresponding aluminum wiring layer was subjected to the AES (Auger Electron Spectroscopy) analysis in a direction of depth. As a result, as shown in FIG. 30, it was confirmed that the composition relatively moderately changed on the gold/aluminum interface, no intermetallic compound layer was present, and a solid solution was formed. As shown in a graph showing the state of a binary system of FIG. 31, if gold is excessively supplied compared to aluminum, and a solid-phase reaction between aluminum and gold is supplied with an energy enough to form a solid solution, a thermodynamically most stable solid solution of a system within a hatched region is formed.

The seventh embodiment of the present invention will be described below.

The seventh embodiment of the present invention improves a repairing step in manufacturing a semiconductor device, and provides a method of manufacturing a semiconductor device, comprising the steps of:

forming a repair functional layer containing a low-melting-point bonding metal on at least one of an aluminum-containing wiring layer formed on an insulating substrate and a gold-containing bonding means formed on a flip-chip semiconductor element;

aligning the aluminum-containing wiring layer with the gold-containing bonding means through the repair functional layer;

heating the aluminum-containing wiring layer and the gold-containing bonding means to a temperature not more than a melting point of the low-melting-point bonding metal to perform tentative bonding; and performing solid-phase diffusion between the aluminum-containing wiring layer and the gold-containing bonding means to form a reaction layer, thereby performing main bonding.

The repair functional layer preferably contains a low-melting-point solder alloy as a main component, and a metal, as an accessory component, for improving electrical and mechanical bonding properties of a bonded surface.

The low-melting-point solder alloy preferably comprises at least one metal selected from the group consisting of lead, tin, zinc, cadmium, bismuth, and indium, and the metal for improving the electrical and mechanical bonding properties of the bonded surface is preferably antimony and zinc.

Pb—Sn—In is preferably used as the low-melting-point solder alloy, and antimony is preferably provided from an alloy Zn—Sb.

The repair functional layer preferably further contains, as a trace component, an element having an affinity for oxygen and selected from the group consisting of zinc, aluminum, titanium, silicon, chromium, beryllium, and a rare-earth element.

The principle of the seventh embodiment of the present invention will be described with reference to the accompanying drawings.

Figure 32A:
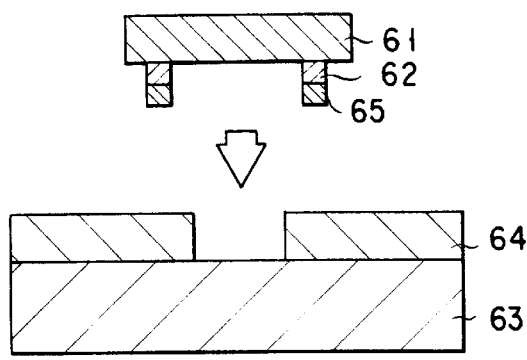
FIGS. 32A to 32F are views showing the concept of a bonding step in a manufacturing method according to the seventh embodiment of the present invention.

FIGS. 32A to 32D are views showing the concept of the bonding step of the present invention. First, the first bonding step (tentative connection) of the present invention will be described. As shown in FIG. 32A, low-melting-point bonding metal bumps 65 are formed on the surfaces of gold bumps 62 formed on a semiconductor element 61.

Figure 32B:
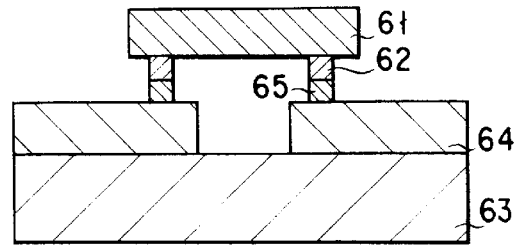

As shown in FIG. 32B, the gold bumps 62 are electrically and mechanically connected to aluminum wiring layers 64 on an insulating substrate 63 through the low-melting-point bonding metal bumps 65 in a heating/compression step at not more than the melting point of the low-melting-point bonding metal. This connection mechanism is achieved such that antimony (Sb) and Zn, which is an element having a strong affinity for oxygen, in the low-melting-point bonding metal is bonded to oxygen (O) to obtain an Sb—O bond or a Zn—O bond in an oxide film on the aluminum wiring surface. This bonding force has a mechanical strength of 1 to 2 kgf/chip, which can withstand handling. However, the bond is not so rigid as in an intermetallic compound formed by a solid-phase reaction and is easily released. Since bonding is performed with the oxide film on the aluminum pad surface, damage to the wiring pattern can be reduced as compared to the solid-phase reaction method. In the solid-phase reaction method, since gold bumps are hard, parallelism must be highly accurately controlled to uniformly crush the bumps in connection at once such as a flip-chip style. In contrast to this, since the low-melting-point bonding metal used in the seventh embodiment of the present invention is soft, the bumps are uniformly crushed without a strict parallelism of a bonding head because the metal serves as a cushion. This connection is subjected to an electrical test.

If this bonding has no problem, the operation advances to the second bonding step (main connection). If any problem is posed, a repairing step is performed.

Figure 32C:
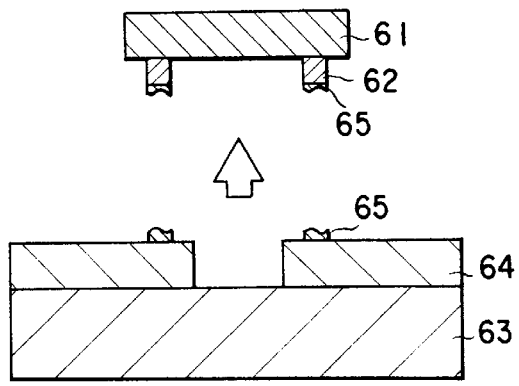
Figure 32D:
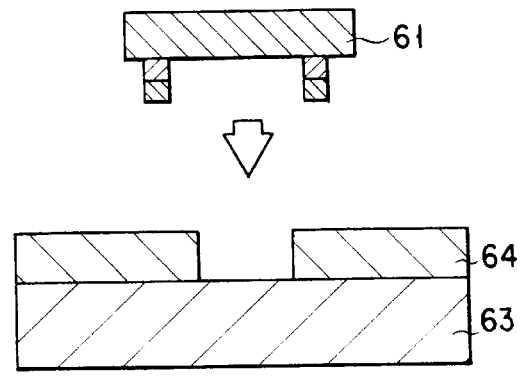

FIG. 32C is a view showing the concept of the repairing step. As a method of removing the semiconductor element 61, there are available two types of methods, i.e., a method of mechanically removing it with a jig, and a method of heating it and diffusing the low-melting-point bonding metal to the gold bump side to remove the semiconductor element 61 without any load. The low-melting-point bonding metal bump and the gold bump/aluminum wiring interface are peeled off in removing the semiconductor element 61. If the low-melting-point bonding metal 65 remains on the aluminum wiring surface, the surface is cleaned to remove the remaining low-melting-point bonding metal 65. Then, as shown in FIG. 32D, the same connection is performed with another semiconductor element 161 to finish the repairing step.

Figure 32E:
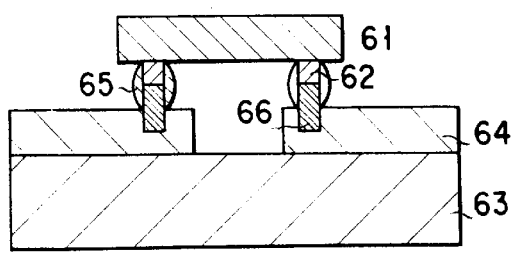
Figure 32F:
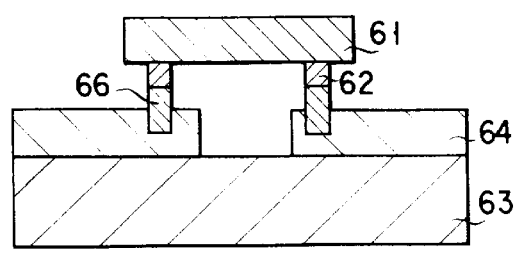

FIGS. 32E and 32F are views showing the concept of the second bonding steps (main connection) in the seventh embodiment of the present invention. A solid-phase diffusion reaction between the gold bumps 62 and the aluminum wiring layers 64, which is caused by thermocompression bonding, forms a reaction layer 66, electrically and mechanically connecting the gold bumps 62 to the aluminum wiring layers 64. At this time, the low-melting-point bonding metal bumps 65 exhibit two types of behaviors. One is that the low-melting-point bonding metal bumps 65 move to the side surfaces of the gold bumps due to compression bonding, as shown in FIG. 32E. The other is that the low-melting-point bonding metal bumps 65 diffuse in the gold bumps, as shown in FIG. 32F. The diffusion in the gold bumps is especially suitable for fine pitch connection because no low-melting-point bonding metal bump is confirmed in appearance. This connection is achieved by formation of the reaction layer, resulting in mechanically rigid and electrically low-resistant connection or highly reliable connection. As has been described above, the two-stage connection method such as the present invention can facilitate the repairing operation for a semiconductor device and obtain highly reliable connection.

The repairing operation can be performed only with the gold bumps without providing, on the gold bumps, any repair functional layer such as the low-melting-point bonding metal bumps in advance. This method can be executed under optimum conditions. According to this method, in the first bonding step (preliminary connection), a solid-phase diffusion reaction between gold and aluminum is performed at a low temperature which allows a repairing operation. The resultant structure in a mechanically weak bonded state is subjected to an electrical test. In the second bonding step (main connection), a solid-phase diffusion reaction is performed at a high temperature which does not allow a repairing operation, thereby achieving electrical and mechanical connection.

The details of the seventh embodiment of the present invention will be described with reference to the accompanying drawings.

FIG. 33 is a sectional view showing part of the first example of a semiconductor device according to the seventh embodiment of the present invention. Gold bumps 212 were formed on a semiconductor element 211. The size of each bump was 50 $\mu$m$\square$, the bump pitch was 80 $\mu$m, and the bump height was 20 $\mu$m.

Low-melting-point bonding metal bumps 16 were formed on the gold bumps 212 by deposition. Each low-melting-point bonding metal bump 16 is an alloy containing Pb—Sn—In as a main component, Zn—Sb as an accessory admixture, and Ti as a trace admixture. A glass substrate 213 had a molybdenum/aluminum multilayered structure as a wiring layer. Molybdenum/aluminum wiring layers 214 were formed on the substrate by sputtering. That is, a 5,000-Å thick aluminum layer was formed on a 500-Å thick molybdenum layer.

In the first bonding step (preliminary connection), the semiconductor element side was heated to 120° C., the glass substrate was heated to 80° C., and compression was performed with a load of 20 g/bump for 1.5 sec to connect all the pads at once. This connection was performed on the low-melting-point bonding metal bump/aluminum pad interface. Although the gold bumps were crushed, they did not reach the aluminum pad interface. This bonding force had a mechanical strength of 1 to 2 kgf/chip, which could withstand handling. No defective connection was found in an electrical test. The semiconductor element was removed by a simple jig.

The portion to be peeled is a low-melting-point bonding metal/aluminum pad interface. The low-melting-point bonding metal remained on the aluminum pad surface was cleaned and removed.

Another semiconductor element was connected according to the same method. No defective connection was found in an electrical test.

In the second bonding step (main connection), the semiconductor element side was heated to 400° C., the glass substrate was heated to 80° C., and compression was performed with a load of 50 g/bump for 1.5 sec to connect all the pads at once. This electrical and mechanical connection was achieved by a reaction layer which was formed by a solid-phase diffusion reaction at the gold bump/aluminum pad interface. At this time, the low-melting-point bonding metal bumps diffused in the gold bumps. No electrically defective connection was caused. Then, a thermal shock test as a reliability test was conducted at −40° C./120° C. for 30 min in 1,000 cycles. As a result, stable electrical connection was realized.

Figure 34A:
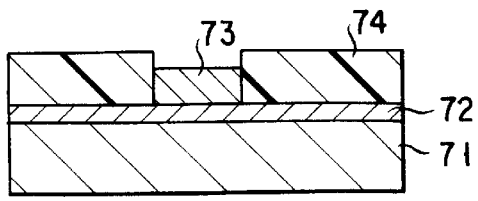
FIGS. 34A to 34E are views for explaining steps used in the seventh embodiment of the present invention.
Figure 34B:
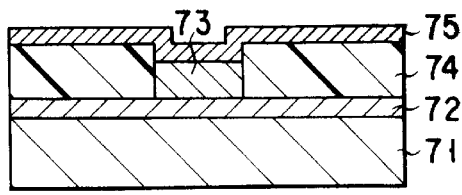
Figure 34C:
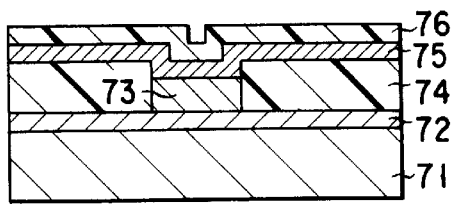
Figure 34D:
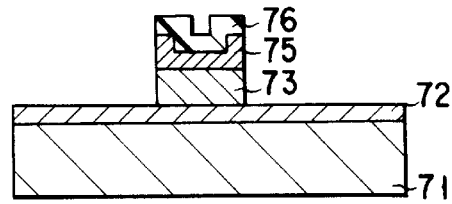
Figure 34E:
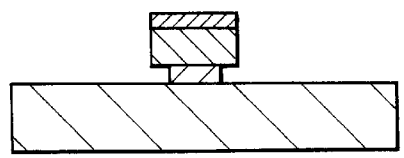

A method of forming a low-melting-point bonding metal bump will be described in detail below. FIGS. 34A to 34E are views for explaining steps used in the seventh embodiment of the present invention. As shown in FIG. 34A, a barrier metal layer 72 is formed on a semiconductor element 71 by sputtering. Examples of the method for forming a low-melting-point bonding metal bump are electroplating, sputtering, deposition, dipping method in which the top portion of Au bump is dipped in a melted low-melting-point bonding metal bath to coat. A resist 74 is formed thereon by photolithography. A gold bump 73 is formed by electroplating, and a low-melting-point bonding metal layer 75 is formed on the entire surface by deposition, as shown FIG. 34B. As shown in FIG. 34C, an etching-resistant resist 76 is formed by e.g. spin coating. A lift-off step is performed as shown in FIG. 34D to etch the resist 74 off, and a barrier metal etching step is further performed as shown in FIG. 34D to etch the resist 74 off, and the resist 76 is peeled off. The steps are finished.

The low-melting-point bonding metal layer 75 is an alloy containing Pb—Zn—In as a main component, Zn—Sb as an accessory admixture, and Ti as a trace admixture.

FIG. 35 is a sectional view showing part of the second example of a semiconductor device according to the seventh embodiment of the present invention. Gold bumps 222 were formed on a semiconductor element 221 by plating. The size of each bump was 30 μm□, the bump pitch was 40 μm, and the bump height was 20 μm. This gold bump had a hourglass shape.

Low-melting-point bonding metal bumps 225 were formed on the gold bumps 222 by deposition. Each low-melting-point bonding metal bump is an alloy containing Pb—Zn—In as a main component, Zn—Sb as an accessory admixture, and Si as a trace admixture. A ceramic substrate 223 had a molybdenum/aluminum multilayered structure as a wiring layer. A molybdenum/aluminum wiring layer 224 was formed on the substrate by sputtering. That is, a 3,000-Å thick aluminum layer was formed on a 500-Å thick molybdenum layer.

In the first bonding step (preliminary connection), the semiconductor element side was heated to 100° C., the ceramic substrate was heated to 80° C., and compression was performed with an ultrasonic wave and a load of 20 g/bump for 5 sec to connect all the pads at once. This connection was performed on the low-melting-point bonding metal bump/aluminum pad interface. Although the gold bumps were crushed, they did not reach the aluminum pad interface. This bonding force had a mechanical strength, which could withstand handling. No defective connection was found in an electrical test. The semiconductor element was removed by a simple jig. The portion to be peeled is a low-melting-point bonding metal/aluminum pad interface. The low-melting-point bonding metal remained on the aluminum pad surface was cleaned and removed. Another semiconductor element was connected according to the same method.

The above repairing step was performed three times. No defective connection was found in an electrical test.

In the second bonding step (main connection), the semiconductor element side was heated to 300° C., the ceramic substrate was heated to 80° C., and compression was performed with a load of 60 g/bump for 5 sec to connect all the pads at once. This electrical and mechanical connection was achieved by a reaction layer which was formed by a solid-phase diffusion reaction at the gold bump/aluminum pad interface. At this time, the low-melting-point bonding metal bumps moved to the side surfaces of the gold bumps. Since each gold bump had a hourglass shape, the pad was not short-circuited with the adjacent pads. No other electrically defective connection was caused.

Then, a thermal shock test as a reliability test was conducted at −40° C./120° C. for 30 min in 1,000 cycles. As a result, extremely stable electrical connection was realized.

A method of forming a low-melting-point bonding metal bump will be described in detail below.

Figure 36A:
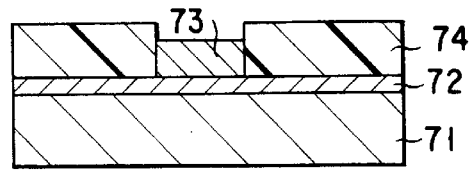
FIGS. 36A to 36C are views for explaining steps used for forming a low-melting-point bonding metal bump.
Figure 36B:
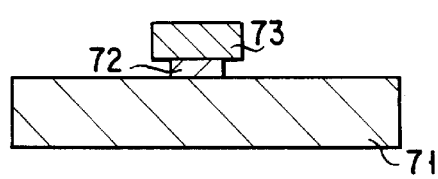
Figure 36C:
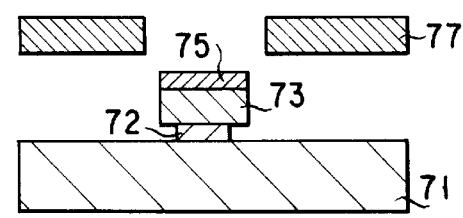

FIGS. 36A to 36C are views for explaining steps used for forming a low-melting-point bonding metal bump. As shown in FIG. 36A, a barrier metal layer 72 is formed on a semiconductor element 71 by sputtering, and a resist 74 is formed thereon by photolithography. A gold bump 73 is formed by electroplating. The resist is removed as shown in FIG. 36B, and the barrier metal is etched as shown in FIG. 36C. Then, a low-melting-point bonding metal layer 75 is formed on the gold bump 73 by deposition using a metal mask. The steps are finished. The low-melting-point bonding metal layer 75 is an alloy containing Pb—Zn—In as a main component, Zn—Sb as an accessory admixture, and Si as a trace admixture.

FIG. 37 is a sectional view showing part of the third example of a semiconductor device according to the seventh embodiment of the present invention.

As shown in FIG. 37, gold bumps 232 were formed on a semiconductor element 231 by plating. The size of each bump was 20 μm□, the bump pitch was 30 μm, and the bump height was 20 μm. This gold bump had a hourglass shape.

Low-melting-point bonding metal bumps 36 were formed on the gold bumps 232 by plating. The gold bumps and the low-melting-point bonding metal bumps were patterned by photolithography. Each low-melting-point bonding metal bump is an alloy containing Bi—In as a main component, Zn—Sb as an accessory admixture, and Be as a trace admixture. A glass substrate 233 had a molybdenum/aluminum multilayered structure as a wiring layer. A molybdenum/aluminum wiring layer 234 was formed on the substrate by sputtering. That is, a 7,000-Å thick aluminum layer was formed on a 500-Å thick molybdenum layer.

In the first bonding step (preliminary connection), the semiconductor element side was heated to 100° C., the glass substrate was heated to 80° C., and compression was performed with a load of 20 g/bump for 5 sec to connect all the pads at once. This connection was performed at the low-melting-point bonding metal bump/aluminum pad interface. Although the gold bumps were crushed, they did not reach the aluminum pad interface. This bonding force had a mechanical strength, which could withstand handling. No defective connection was found in an electrical test. The semiconductor element side was heated to 300° C. and kept for 5 sec without any load. The low-melting-point bonding metal bumps diffused in the gold bumps. For this reason, no mechanical bonding force acted, and the semiconductor element was removed by a simple jig. The portion to be peeled is the low-melting-point bonding metal and gold/ aluminum pad interface. The low-melting-point bonding metal did not remain on the aluminum pad surface. Another semiconductor element was connected according to the same method.

The above repairing step was performed five times. No defective connection was found in an electrical test.

In the second bonding step (main connection), the semiconductor element side was heated to 320° C., the glass substrate was heated to 60° C., and compression was performed with a load of 60 g/bump for 5 sec to connect all the pads at once. This electrical and mechanical connection was achieved by an intermetallic compound which was formed by a solid-phase diffusion reaction at the gold bump/aluminum pad interface. At this time, since the low-melting-point bonding metal bumps diffused in the gold bumps, the pad was not short-circuited with the adjacent pads. No other electrically defective connection was caused.

Then, a thermal shock test as a reliability test was conducted at −40° C./120° C. for 30 min in 1,000 cycles. As a result, extremely stable electrical connection was realized.

Figure 38A:
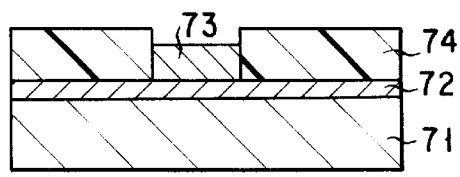
FIGS. 38A to 38C are views for explaining steps used for manufacturing the semiconductor device according to the seventh embodiment.
Figure 38B:
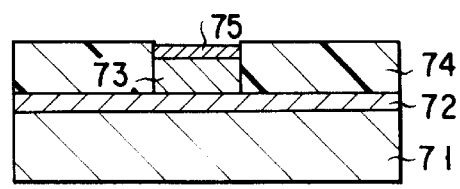
Figure 38C:
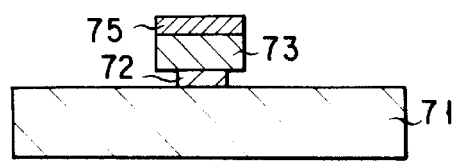

A method of forming a low-melting-point bonding metal bump will be described in detail below. FIGS. 38A to 38C are views for explaining steps used in this example. As shown in FIG. 38A, a barrier metal layer 72 is formed on a semiconductor element 71 by sputtering, and a resist 74 is formed thereon by photo-lithography. A gold bump 73 is formed by electroplating. As shown in FIG. 38B, a low-melting-point bonding metal layer 75 is formed thereon by electroplating. As shown in FIG. 38C, the resist is removed, and the barrier metal is etched. The steps are finished. The low-melting-point bonding metal layer 75 is an alloy containing Zn—Bi—In as a main component, Zn—Sb as an accessory admixture, and Be as a trace admixture.

Note that a melting temperature $T_a$ of the low-melting-point bonding metal in preliminary connection and a solid-phase diffusion reaction temperature $T_b$ of the gold bump in main connection have a relationship $T_a<T_b$.

When the low-melting-point bonding metal in a solid-phase state is not diffused but melted in main connection, the low-melting-point bonding metal layer preferably has a thickness of 1 $\mu$m to 4 $\mu$m while the gold bump has a thickness of, e.g., 20 $\mu$m. If the thickness of the low-melting-point bonding metal layer is less than 1 $\mu$m, connection is difficult; and, if it exceeds 4 $\mu$m, short-circuiting tends to occur.

A preferable maximum thickness of the low-melting-point bonding metal layer is calculated as follows, for example.

Assume that a solder 79 is formed on a gold bump 78, as shown in FIG. 39A. The solder 79 is in a state of FIG. 39B in preliminary connection and moves to the side surface of the gold bump in main connection, as shown in FIG. 39B.

In FIG. 39C, if the total volume of the gold bump 78 and the solder 79 is represented by $V_1$, and the volume of a frustum indicated by a dotted line is $V_2$, $$V_1=\pi h/6\{h^2+3(r_0^2+r^2)\}$$

$$V_2=\pi h/3(r_0^2+r_0r+r^2)$$

A volume V of the solder bump on the side surface of the gold bump is $$V=V_1-V_2=\pi h/6\{h^2+(r_0-r)^2\}$$

If $V=\pi r^2 y$ $$\therefore y=h/6r^2\{h^2+(r_0-r)^2\}$$

For example, if h=20 $\mu$m, $r_0$=20 $\mu$m, and r=18 $\mu$m, y=4.16 ($\mu$m)

to obtain a bump pitch of $2r_0$, which corresponds to a pitch of 40 $\mu$m.

From this result, if a solder bump has a thickness of 4.16 $\mu$m or more in a case of a 20-$\mu$m thick gold bump, short-circuiting tends to occur.

The eighth embodiment of the present invention will be described below.

According to the eighth embodiment of the present invention, there is provided a semiconductor device comprising:

an insulating substrate;

a wiring layer formed on the insulating substrate and essentially consisting of a metal alloy of the first metal of at least one material selected from the group consisting of metals, which can form an alloy with a bonding means by solid-phase diffusion, such as gold, copper, tin, and aluminum, and the second metal of at least one material selected from the group consisting of metals, which does not perform solid-phase diffusion with the bonding means, such as molybdenum, tungsten, and tantalum;

the bump-like bonding means which is bonded to a surface of the wiring layer by forming a reaction layer by a solid-phase diffusion reaction and essentially consists of at least one metal selected from the group consisting of gold, silver, copper, nickel, palladium, and platinum; and a semiconductor element formed on the bonding means.

The wiring layer is an alloy of the first metal which is alloyed with the bump by a solid-phase diffusion reaction, and the second metal which is not alloyed, facilitating a repairing operation of the semiconductor device.

For example, in a case of gold bumps and an aluminum wiring layer, molybdenum is used as the second metal. Molybdenum is a metal material which forms an alloy not with gold but only with aluminum. By mixing molybdenum in the aluminum wiring layer, a wiring pattern formed by an aluminum-molybdenum alloy is formed. An alloy is formed between the wiring pattern and the gold bumps on a semiconductor element by a solid-phase diffusion reaction caused by thermocompression bonding, achieving electrical and mechanical connection. At this time, the mechanical connection strength is decreased compared with connection of gold only with aluminum because molybdenum does not form an alloy with gold. Therefore, a repairing operation of a semiconductor device can be facilitated.

An embodiment of the present invention will be described in detail below with reference to the accompanying drawings.

Figure 40:
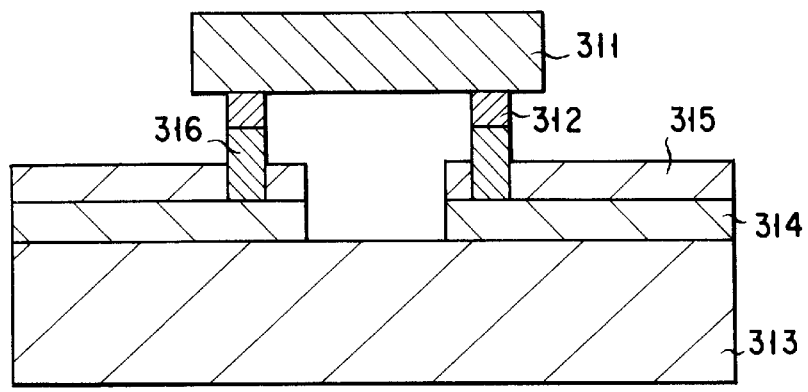
FIG. 40 is a sectional view showing part of the first example of a semiconductor device according to the eighth embodiment of the present invention.

FIG. 40 is a sectional view showing part of the first example of a semiconductor device according to the eighth embodiment of the present invention. As shown in FIG. 40, gold bumps 312 were formed on a semiconductor element 311. The size of each bump was 50 $\mu$m☐, the bump pitch was 80 $\mu$m, and the bump height was 20 $\mu$m. A ceramic substrate 313 had a molybdenum/aluminum/molybdenum multilayered structure as a wiring layer. A molybdenum/aluminum/molybdenum wiring layer 314 was formed on the substrate by sputtering. That is, a 5,000-Å thick aluminum layer was formed on a 500-Å thick molybdenum layer, and a 100-Å thick molybdenum was formed thereon. The resultant structure was annealed at about 1,000° C. to form molybdenum-aluminum alloy layers 315 on the surface of the wiring layer 314.

In a bonding step, the semiconductor element side was heated to 300° C., the glass substrate was heated to 60° C., and compression was performed with a load of 50 g/bump for 3.5 sec to form gold-aluminum alloy layers 316, connecting all the pads at once. The bonding force had a mechanical strength of 2 to 3 kgf/chip, which could withstand handling. No defective connection was found in an electrical test.

The semiconductor element was removed by a simple jig. The portion to be peeled is a gold bump/molybdenum-aluminum alloy interface. Another semiconductor element was connected according to the same bonding method described above. The resultant connection was good. Finally, the connection interface was sealed with a thermosetting resin to increase the mechanical strength.

Then, a thermal shock test was conducted as a reliability test (−40° C./120° C., 30 min/30 min, 1,000 cycles) to obtain extremely stable electrical connection. The molybdenum/aluminum alloy layer 315 was subjected to the AES (Auger Electron Spectroscopy) analysis in a direction of depth. As a result of the analysis in the direction of depth, it was confirmed that the surface of the alloy layer was molybdenum rich, and the composition changed to an aluminum-rich composition in the direction of depth.

Figure 41:
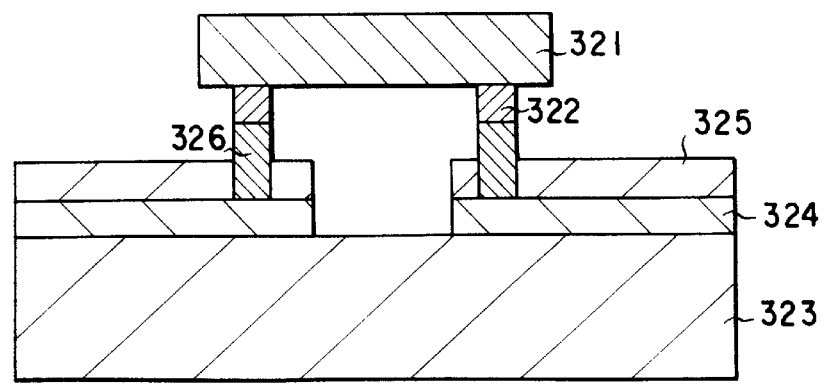
FIG. 41 is a sectional view showing part of the second example of a semiconductor device according to the eighth embodiment of the present invention.

FIG. 41 is a sectional view showing part of the second example of a semiconductor device according to the eighth embodiment of the present invention.

As shown in FIG. 41, gold bumps 322 were formed on a semiconductor element 321. The size of each bump was 30 $\mu m\square$, the bump pitch was 40 $\mu m$, and the bump height was 20 $\mu m$. A wiring layer on a glass substrate 323 was formed using sputtering as follows.

First, an aluminum plate having a purity of 99.999% and a tungsten plate having a purity of 99.999% were mounted on predetermined positions in an apparatus which could simultaneously sputter a plurality of targets, e.g., a binary simultaneous ion beam sputtering apparatus.

Next, a stainless steel mask in which a predetermined pattern was removed corresponding to a connected portion, was covered the glass substrate 323 on which a wiring pattern 324 was formed. The resultant glass substrate 323 was set to a predetermined position in the apparatus.

The aluminum and tungsten targets were respectively sputtered by an argon ion beam or the like at the same time. A thin film in which aluminum and tungsten were uniformly mixed (composition consisting of 90% of aluminum and 10% of tungsten in atomic percent) was stacked on the glass multilayered substrate 323 to a film thickness of 0.5 $\mu m$. At this time, the glass multilayered substrate may be heated to about 100° C.

In this manner, tungsten-aluminum alloy wiring layers 325 having a predetermined pattern shape were selectively formed on the substrate.

Note that the connected portion can be formed such that a metal thin film layer is formed without using the stainless steel mask, and selective etching is performed by lithography using a predetermined mask.

In a bonding step, the semiconductor element side was heated to 400° C., the glass substrate was heated to 60° C., and compression was performed with a load of 50 g/bump for 1.5 sec to form gold-aluminum alloy layers 326, connecting all the pads at once. The bonding force had a mechanical strength of 2 to 3 kgf/chip, which could withstand handling. No defective connection was found in an electrical test. The semiconductor element was removed by a simple jig. The portion to be peeled is a gold bump/molybdenum-aluminum alloy interface. Another semiconductor element was connected according to the same bonding method described above. The resultant connection was good. Finally, the connected interface was sealed with a thermosetting resin to increase the mechanical strength.

Then, a thermal shock test as a reliability test was conducted at −40° C./120° C. for 30 min in 1,000 cycles to obtain extremely stable electrical connection.

As has been described above, according to the present invention, the wiring layer is an alloy of the first metal which forms an alloy with the bumps by a solid-phase diffusion reaction, and the second metal which does not form an alloy with the bumps. With this structure, the mechanical strength of the alloy layer formed by solid-phase diffusion connection can be decreased to facilitate a repairing operation of a semiconductor device.

The ninth embodiment of the present invention will be described below.

According to the ninth embodiment of the present invention, there is provided an electronic circuit device comprising:

a transparent substrate;

an aluminum-containing wiring layer formed on the substrate;

a bump-like gold-containing bonding means bonded on the wiring pattern by forming a reaction layer by solid-phase diffusion; and a semiconductor element formed on the bonding means, wherein the reaction layer comprises the intermetallic compound having a highest $Au_4Al$ content.

Examples of the electronic circuit are a liquid crystal, and semiconductor device.

The liquid crystal display device according to the ninth embodiment of the present invention will be described in detail with reference to FIG. 42.

An Al wiring pattern 912 is formed on the surface of a glass substrate 911. A display unit 913 constituted by, e.g., a TFT transistor, a liquid crystal, a spacer, a transparent electrode, and the like is formed on the major surface of the glass substrate 911. A large number of gold bumps 915 are formed on the surface of a semiconductor element 914. The semiconductor element 914 is electrically and mechanically connected through the gold bumps 915 to the Al wiring pattern 912 on the substrate 911 around the display unit 913 by forming a reaction layer due to a solid-phase diffusion reaction caused by thermo-compression bonding. The composition of the reaction layer has mainly intermetallic compound having the highest $Au_4Al$ content.

The content of $Au_4Al$ in the intermetallic compound produced between the gold bumps and the wiring pattern is preferably 50% or more, and more preferably 80% or more. FIG. 43 is a schematic view showing intermetallic compounds according to the ninth embodiment of the present invention. As shown in FIG. 43, Au, an $Au_4Al$ intermetallic compound 905, and another intermetallic compound (e.g., $Au_5Al_2$) 906 are arranged between an Al wiring pattern 902 and a gold bump 904 in the multilayered form in an order from the bump 904. In this arrangement, the volume of the intermetallic compound 905 is the highest content in the total intermetallic compound. According to the present invention, the gold bump can be connected to the Al wiring pattern without a thermal damage to the semiconductor element. This connection is especially advantageous to a liquid crystal display device which cannot be processed at a high temperature due to its structure. The present invention is not limited to the liquid crystal display device and can also be applied to the other electrical circuit device.

In the present invention, attention is paid to a volume when the Au—Al intermetallic compounds are formed by a solid-phase diffusion reaction between the Al wiring pattern and the gold bumps caused by thermocompression bonding.

Figure 44:
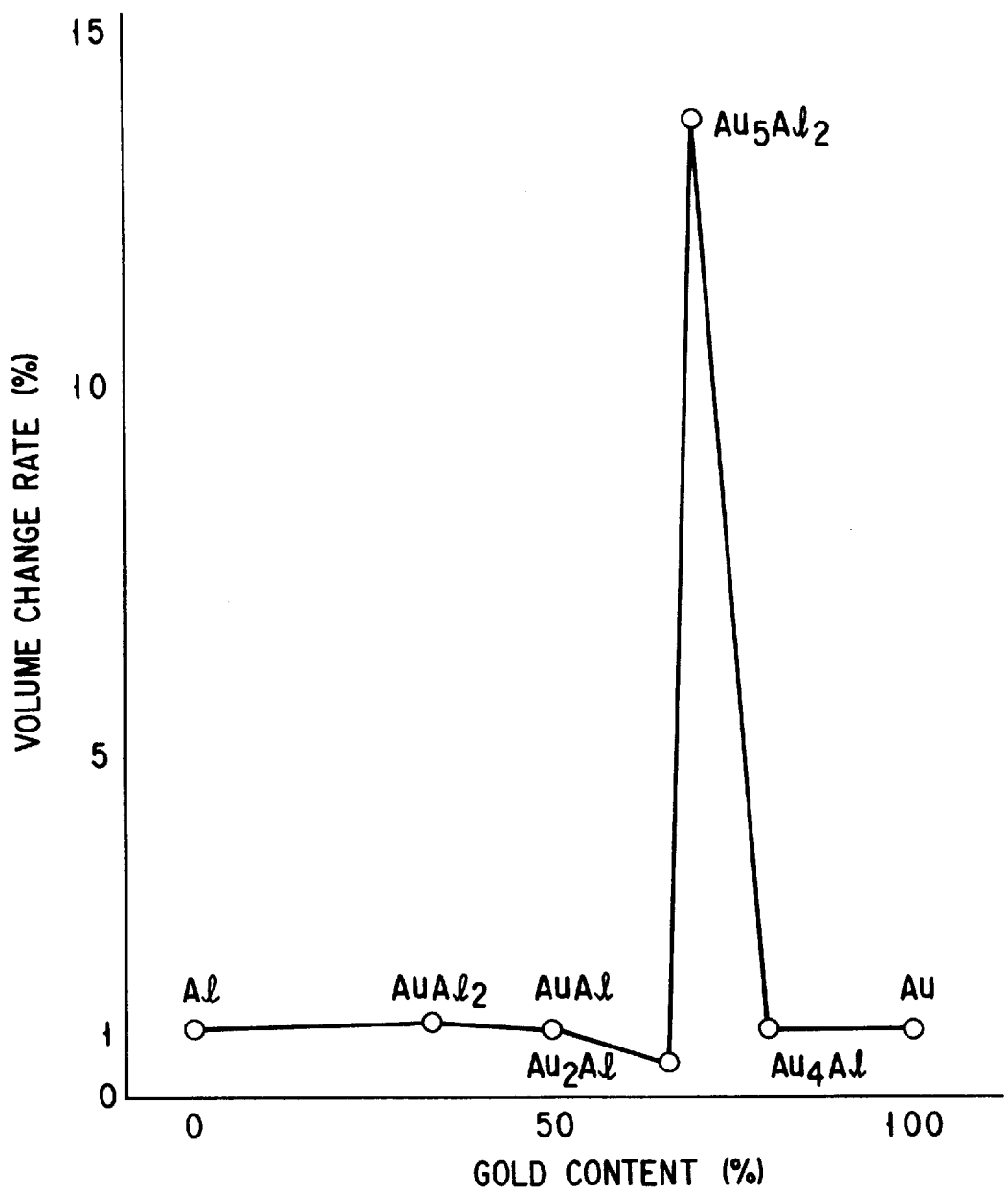
FIG. 44 is a graph showing a relationship between the gold composition of an intermetallic compound and the rate of change in volume of the intermetallic compound according to the ninth embodiment of the present invention.

Cracking occurs in a connected portion as defective connection in a connection reliability test. The volume change of the Au—Al intermetallic compounds is considered to cause occurrence and growth of cracking. As an index for estimating the volume change, a value obtained by dividing the unit volume of a crystal lattice by a volume before formation of a compound is defined as a volume change rate. Table 2 shows volume change rates calculated from crystal structures and lattice constants. FIG. 44 shows a relationship between the gold composition of an intermetallic compound and the volume change of the intermetallic compound.

cracking occurs in the connected portion, obtaining stable connection having almost the same connection resistance value as the initial value.

As shown in FIG. 43, it was confirmed by the Auger electron spectroscopy and the X-ray diffraction analysis that stable connection between the gold bump and the Al wiring pattern could be obtained if the intermetallic compound $Au_4Al$ was contained in the highest content, preferably 50% or more, and more preferably 80% or more.

In this manner, according to the ninth embodiment of the present invention, there is provided an electrical circuit device such as a liquid crystal display device having a micro electric element in which cracking caused by a thermal shock does not occur in a connected portion to obtain high connection reliability.

TABLE 2

| Crystal | Structure | Unit Volume $(nm^3)\ a^3$ | Number of Atoms Contained In Unit Volume | | Volume Before Formation Of Compound $(nm^3)$ | Volume Change Rate (Rate) |
|---|---|---|---|---|---|---|
| | | | Al | Au | | |
| Al | Cubic a = 4.05 | 0.0664 | 4 | 0 | 0.0664 | 1.00 |
| $AuAl_2$ | Cubic a = 6.00 | 0.216 | 2 | 1 | 0.2010 | 1.10 |
| AuAl | Monoclinic a = 6.41 b = 3.33 c = 6.33 β = 93 | 0.135 | 4 | 4 | 0.1343 | 1.00 |
| $Au_2Al$ | Tetragonal a = 3.35 c = 8.89 | 0.0998 | 4 | 8 | 0.2022 | 0.49 |
| $Au_5Al_2$ | Hexagonal a = 7.71 c = 41.9 | 6.471 | 8 | 20 | 0.4723 | 13.70 |
| $Au_4Al$ | Cubic a = 6.92 | 0.331 | 4 | 16 | 0.3380 | 0.98 |
| Au | Cubic a = 4.08 | 0.0679 | 0 | 4 | 0.0679 | 1.00 |

In an Au—Al solid-phase diffusion reaction, gold diffuses first. Therefore, intermetallic compounds are produced in an order from a compound having a low gold content, i.e., $AuAl_2$, $AuAl$, $Au_2Al$, $Au_5Al_2$, and $Au_4Al$, as shown in Table 2. There is a volume shrinkage process in production of $Au_2Al$. There is a large volume expansion process in production of $Au_2Al$ upon diffusion of gold due to its large lattice constant. Since this $Au_5Al_2$ intermetallic compound is hard and brittle, an initial connection resistance value is stable. However, since a residual stress is accumulated through the volume expansion process, cracking occurs in the connection portion during a reliability test as of a thermal shock. This cracking causes a variation in connection resistance value, and the connection resistance value maximally reaches 10 times or more the initial value.

When an $Au_4Al$ intermetallic compound is to be generated by further diffusing gold in a heating process, great volume shrinkage occurs to restore almost the original volumes of gold and aluminum before a solid-phase diffusion reaction. The residual stress can rarely be left or can be reduced. In a solid-phase diffusion reaction system with an Al thin film pattern such as a gold bump with an Al wiring pattern, all the five types of intermetallic compounds shown in Table 2 are focused to $Au_4Al$, which is the thermodynamically most stable intermetallic compound. Under the conditions in which $Au_4Al$ is produced, the initial connection resistance value is stable, and the residual stress can rarely be left or can be reduced. For this reason, even if a reliability test as of a thermal shock is conducted, no In order to decrease the content of $Au_5Al_2$ as a defective connection factor, a heating process is preferably performed at once in the connection step to change $Au_5Al_2$ to $Au_4Al$. By such a heating process, a solid-phase diffusion reaction can be controlled so as to make the content of the intermetallic compound $Au_4Al$ highest. In production of $Au_5Al_2$, the residual stress can rarely be left or can be reduced.

An example of the liquid crystal display device according to the ninth embodiment of the present invention will be described below.

This liquid crystal display device has the following structure shown in FIG. 42. That is, the display unit 913 is formed on the major surface of the glass substrate 911 having the Al wiring pattern 912. The semiconductor element 914 is connected to the Al wiring pattern 912 around the display unit 913 through the gold bumps 915. The gold bumps 915 formed on the semiconductor element 914 are directly connected to the Al wiring pattern 912 by solid-state diffusion between the bumps 915 and the Al wiring pattern 912. The Al wiring pattern 912 on the glass substrate 911 has a multilayered structure in which a molybdenum layer serves as a lower layer. The molybdenum layer is formed by sputtering to have a thickness of 50 nm, and the Al wiring pattern is formed by sputtering to have a thickness of 500 nm. Each gold bump 915 was formed such that the size was 50 μm□, the height was 20 μm, and the pitch was 80 μm. The semiconductor element 914 side was heated to 400° C., the glass substrate 911 was heated to 80° C., and compression was performed with a load of 50 g/bump for 1.5 sec to connect all the bumps at once. No electrically defective connection was found in this connection.

The obtained liquid crystal display device was subjected to a thermal shock test as a reliability test at −40° C./120° C. for 30 min in 1,000 cycles. As a result, extremely stable electrical connection could be obtained, as shown in FIG. 45. FIG. 45 is a graph showing a relationship between the number of cycles and a resistance in the thermal shock test.

The connection section between the gold bump and the Al wiring pattern was observed with an SEM (scanning electron microscope). As a result, no defect such as a crack was observed.

After the connected portions between the gold bumps and the Al wiring pattern were peeled off, the X-ray diffraction analysis was performed. FIG. 46 shows the result of this X-ray diffraction analysis. As shown in FIG. 46, it was confirmed that $Au_4Al$ related to connection stability was produced in the largest amount. Further, in a connection step of the bumps, the performance of the liquid crystal and the like in the display unit was not degraded.

A comparative example of the liquid crystal display device according to the ninth embodiment of the present invention will be described below.

A liquid crystal display device having the same structure shown in FIG. 42 as in the above example was assembled following the same procedures except that the semiconductor element side was heated to 280° C., the glass substrate was heated to 80° C., and compression was performed with a load of 50 g/bump for 0.01 sec to connect all the bumps at once in connection of a semiconductor element to an Al wiring pattern on a glass substrate through gold bumps. No electrically defective connection was found in this connection.

The obtained liquid crystal display device was subjected to a thermal shock test as a reliability test (−40° C./120° C., 30 min/30 min, 1,000 cycles). As a result, the connection resistive value increased about 50 times, as shown in FIG. 47. FIG. 47 is a graph showing a relationship between the number of cycles and a resistance in the comparative example.

The connection section between the gold bump and the Al wiring pattern was observed with an SEM (scanning electron microscope). It was found that cracking occurred in the connected portion.

After the connected portions between the gold bumps and the Al wiring pattern were peeled off, X-ray diffraction analysis was performed. FIG. 48 shows the result. As shown in FIG. 48, it was confirmed that $Au_4Al$ related to connection stability was not sufficiently produced, and $Au_5Al_2$ was produced in the largest amount.

Note that the electrical circuit device having such mounting structure according to the present invention can be applied to, e.g., the semiconductor device according to the second embodiment of the present invention.

There is provided a semiconductor device comprising:
   an aluminum-containing wiring layer formed on an insulating substrate;
   a gold-containing bump-like bonding means bonded on the surface of the wiring layer by forming a reaction layer by solid-phase diffusion; and
   a semiconductor element formed on the bonding means.

Such an arrangement is not defined to the flip chip type mounting, it can be used for the other bonding technique such as a wire bonding. The reaction layer comprises an intermetallic compound containing $Au_4Al$ in the highest content by a solid-phase diffusion reaction between the Al electrode on a semiconductor element and the gold wire caused by thermocompression bonding, thereby improving the connection reliability between the Al electrode and the gold wire.

A structure mounted with a semiconductor element utilizing the bonding structure in the ninth embodiment of the present invention will be described in detail with reference to the accompanying drawing.

FIG. 49 is a sectional view showing an application of the ninth embodiment of the present invention. An Al wiring pattern 92 is formed on the surface of an insulating substrate 91. A large number of gold bumps 94 are formed on the surface of a semiconductor element 93. The semiconductor element 93 is electrically and mechanically connected to the Al wiring pattern 92 on the insulating substrate 91 through the gold bumps 94 by forming a reaction layer in a solid-phase diffusion reaction caused by thermocompression bonding. The reaction layer comprises an intermetallic compound and a solid solution. The composition of the intermetallic compound has the highest $Au_4Al$ content.

The insulating substrate having the Al wiring pattern comprises a circuit board having an Al wiring pattern formed on one or two surfaces of a substrate which consists of a ceramic, e.g., alumina or aluminum nitride, a circuit board having an Al wiring pattern formed on one or two surfaces of a glass substrate, and the like. On the circuit board having Al wiring patterns formed on the two surfaces, the wiring patterns on the two surfaces are allowed to be connected via through holes.

The content of $Au_4Al$ in the intermetallic compound produced between the gold bumps and the wiring pattern is preferably 50% or more, and more preferably 80% or more. As shown in the schematic view of FIG. 43, the $Au_4Al$ intermetallic compound 905 and another intermetallic compound (e.g., $Au_5Al_2$) 906 are arranged in the multilayered form between the Al wiring pattern 902 and the gold bump 904 in an order from the bump 904. In this arrangement, the volume of the intermetallic compound 905 is the highest content in the total intermetallic compound.

According to the present invention, with the intermetallic compound whose composition has the highest $Au_4Al$ content, there can be provided the structure mounted with a semiconductor element in which cracking caused by a thermal shock cannot occur in a connected portion to obtain high connection reliability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electronic circuit device comprising:
   a substrate;
   a wiring layer formed on a surface of said substrate;
   bump-like bonding means formed on said wiring layer;
   a barrier metal layer formed on said bonding means; and
   a micro electronic element formed on said barrier metal layer,
   wherein one of said wiring layer and said bump-like bonding means is formed of gold with the other being formed of aluminum, and solid-phase diffsion is performed at least either between said wiring layer and said bonding means or between said bonding means and an electrode of said micro electronic element at temperatures below a eutectic temperature of gold and aluminum.

2. An electronic circuit device comprising:
a substrate;
a wiring layer formed on a surface of said substrate;
bump-like bonding means formed on said wiring layer;
a barrier metal layer formed on said bonding means; and
a micro electronic element formed on said barrier metal layer,
wherein the wiring layer and the bump-like bonding means are formed of the same metal selected from the group consisting of gold and aluminum, and solid-phase diffusion is performed at least either between said wiring layer and said bonding means or between said bonding means and an electrode of said micro electronic element at temperatures below the melting point of the metal forming each of the wiring layer and the bump-like bonding means.

3. A semiconductor device comprising:
an insulating substrate;
a wiring layer formed on said insulating substrate;
bump-like bonding means bonded to a surface of said wiring layer by solid-phase diffusion;
a barrier metal layer formed on said bonding means; and
a semiconductor element formed on said barrier metal layer,
wherein one of said wiring layer and said bump-like bonding means is formed of gold with the other being formed of aluminum, and said solid-phase diffusion is performed at temperatures below a eutectic temperature of gold and aluminum.

4. A semiconductor device comprising:
an insulating substrate;
a wiring layer formed on said insulating substrate and essentially consisting of at least one metal selected from the group consisting of gold and aluminum;
bump-like bonding means bonded to a surface of said wiring layer by solid-phase diffusion and essentially consisting of at least one metal selected from the group consisting of gold and aluminum;
a barrier metal formed on said bonding means; and
a microelectronic element formed on said barrier metal layer,
wherein said wiring layer and said bump-like bonding means are formed of the same metal selected from the group consisting of gold and aluminum, and said solid-phase diffusion is performed at temperatures below the melting point of the metal.

5. A micro electronic circuit device comprising:
an insulating substrate,
a wiring layer formed on said insulating substrate and consisting essentially of aluminum;
bump-like bonding means consisting essentially of gold and bonded to a surface of said wiring layer by solid-phase diffusion at temperatures below a eutectic temperature of gold and aluminum, a reaction layer having at least one material selected from the group consisting of an amorphous alloy and a solid solution being formed as a result of said solid-phase diffusion;
a barrier metal layer formed on said bonding means and
a micro electronic element formed on said barrier metal layer.

6. A micro electronic circuit device comprising:
an insulating substrate;
a wiring layer formed on said insulating substrate and consisting essentially of aluminum;
bump-like bonding means consisting essentially of aluminum and bonded to a surface of said wiring layer by solid-phase diffusion at temperatures below the melting point of aluminum;
a barrier metal layer formed on said bonding means; and
a semiconductor element formed on said barrier metal layer.

7. A device according to claim 1, wherein said micro electronic element is a package incorporating a semiconductor element.

8. A device according to claim 1, wherein said micro electronic element is a passive chip element.

9. A device according to claim 1, wherein said substrate is a printing head having a ceramic substrate on which a wiring layer is formed.

10. A device according to claim 1, wherein said substrate is a display element.

11. A device according to claim 1, wherein said wiring layer has a multilayered structure in which a metal layer and an oxide layer of said metal are alternately stacked.

12. A device according to claim 8, wherein said wiring layer has a multilayered structure in which a metal layer and an oxide layer of said metal are alternately stacked.

13. A device according to claim 8, wherein said wiring layer contains aluminum, said bonding means contains gold, a reaction layer is formed between said wiring layer and said bonding means by solid-phase diffusion, said a reaction layer comprising intermetallic compound having a highest $Au_4Al$ content.

14. A semiconductor device comprising:
an insulating substrate;
a wiring layer formed on said insulating substrate and essentially consisting of a metal alloy of the first metal of at least one material selected from the group consisting of gold, copper, tin, and aluminum, and the second metal of at least one material selected from the group consisting of molybdenum, tungsten, and tantalum;
bump-like bonding means which is bonded to a surface of said wiring layer by forming a reaction layer by a solid-phase diffusion reaction and essentially consists of at least one metal selected from the group consisting of gold, silver, copper, nickel, palladium, and platinum; and
a semiconductor element formed on said bonding means.

15. A liquid crystal display device comprising:
first and second substrates opposing each other;
a liquid crystal sandwiched between said first and second substrates;
a wiring layer formed on said first substrate, having a thickness of 3,000 Å to 8,500 Å, and said wiring layer including a top layer having a thickness of 2,500 Å to 8,000 Å and containing aluminum as a main component;
bump-like bonding means bonded on said top layer by solid-phase diffusion and essentially consisting of at least one metal selected from the group consisting of gold, copper, and aluminum; and
a semiconductor element formed on said bonding means.

16. A device according to claim 15, wherein said wiring layer has a multilayered structure in which a metal layer and an oxide layer of said metal are alternately stacked.

17. A device according to claim 15, wherein said wiring layer further comprises a first pad array and a second pad array, said first and second pad arrays being arranged such that a central coordinate position of said second pad array is defined as (xi+j,yi+k) (i=1 to n; j and k are moving distances) when a central coordinate position of said first pad array is defined as (xi,yi) (i=1 to n), and said bonding means is formed on one of said first and second pad arrays.

18. An electrical circuit device comprising:

a substrate;

an aluminum-containing wiring layer formed on said substrate;

bump-like gold-containing bonding means bonded on said wiring layer by forming a reaction layer by solid-phase diffusion; and a micro electrical element formed on said bonding means, wherein said reaction layer comprises a intermetallic compound having a highest $Au_4Al$ content.

19. A device according to claim 18, wherein said substrate is a display element.

20. A circuit substrate comprising: a substrate; and a multilayered wiring layer constituted by a first metal layer formed on said substrate and essentially consisting of at least one metal selected from the group consisting of gold, copper, tin, and aluminum, an oxide film formed on said first metal layer and essentially consisting of oxygen the same metal as that of said first metal layer, and a second metal layer formed on said metal oxide film and consisting of a metal as in said first metal layer.

* * * * *